United States Patent [19]
Ohtsuka et al.

[11] Patent Number: 5,651,837
[45] Date of Patent: Jul. 29, 1997

[54] SOLAR CELL MODULE AND MANUFACTURING METHOD THEREOF

[75] Inventors: Takashi Ohtsuka, Kyoto; Kimitoshi Fukae; Yuji Inoue, both of Nara, all of Japan

[73] Assignee: Canon Kabushiki Kaisha, Tokyo, Japan

[21] Appl. No.: 544,161

[22] Filed: Oct. 17, 1995

[30] Foreign Application Priority Data

Oct. 11, 1995 [JP] Japan ................. 7-262877

[51] Int. Cl.⁶ .............. H01L 31/048; E04D 13/18
[52] U.S. Cl. ............. 136/251; 136/291; 136/244; 52/173.3; 257/433; 437/2; 437/4; 437/207; 437/219
[58] Field of Search ................. 136/251, 259, 136/291; 437/2, 4, 207, 219; 52/173.3; 257/433

[56] References Cited

U.S. PATENT DOCUMENTS

| | | | |
|---|---|---|---|
| 5,092,939 | 3/1992 | Nath et al. | 136/251 |
| 5,391,235 | 2/1995 | Inoue | 136/244 |
| 5,409,549 | 4/1995 | Mori | 136/244 |
| 5,457,057 | 10/1995 | Nath et al. | 437/2 |
| 5,480,494 | 1/1996 | Inoue | 136/251 |

FOREIGN PATENT DOCUMENTS

| | | | |
|---|---|---|---|
| 6-204544 | 7/1994 | Japan | 136/251 |
| 7-131048 | 5/1995 | Japan | H01L 31/042 |

*Primary Examiner*—Aaron Weisstuch
*Attorney, Agent, or Firm*—Fitzpatrick, Cella, Harper & Scinto

[57] ABSTRACT

A solar cell module is provided which is excellent in foldability and durability. The filler thickness in the downwardly facing parts, engagement parts, and upwardly facing folded parts of the solar cell module are made thinner than the filler that is placed at the other non-folded parts.

118 Claims, 12 Drawing Sheets

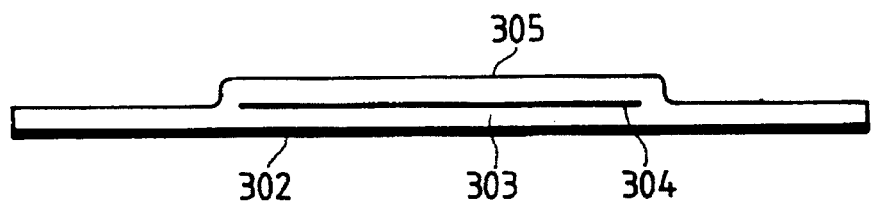
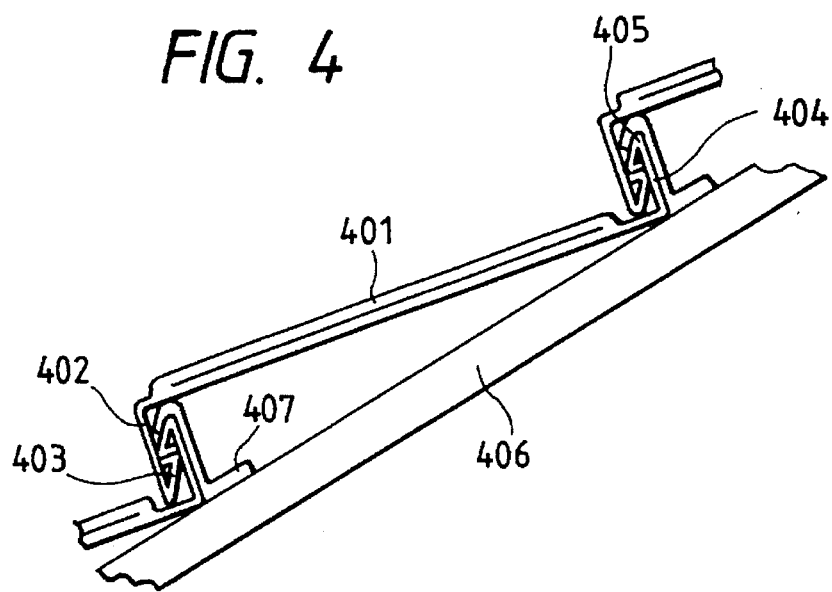
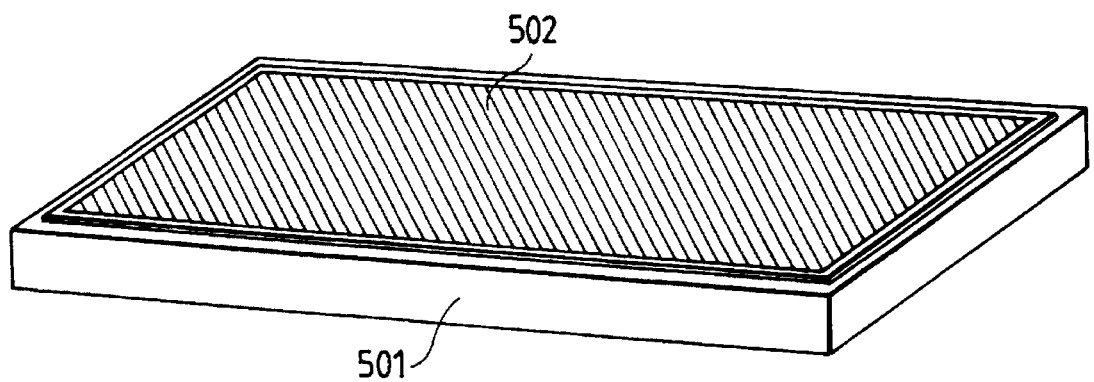

SOLAR CELL MODULE AND MANUFACTURING METHOD THEREOF

BACKGROUND OF THE INVENTION

1. Field of the Invention

The present invention relates to a solar cell module and a production process thereof.

2. Related Background Art

Solar cells which utilize solar energy are expected to be a clean and reproducible energy source, from residential use to large scale electricity generation.

In particular, the use of solar cell modules on roofs of buildings is predicted as a means of utilizing limited spaces. Solar cell modules built in roof structures hold big promise to reduce the construction cost of buildings because such solar cell modules are installed as part of the construction process and do not need frames for installation.

Durability against environmental conditions such as temperature, humidity, and mechanical shock are required when solar cells are used. For this purpose, solar cell modules used conventionally are made by sealing the solar cell elements in a filler and by covering the surface with a durable plastic film or glass plate.

A most preferable structure for integral type solar cell modules built into a building roof requires that the solar modules be made in the following manner: the front side surface is sealed by a durable plastic film protector; a reinforcing plate is used at the back side surface without using a frame; and the non-generating area is applied to plasticity processing integrally with the reinforcing plate.

A solar module of such structure, which is mechanically reinforced by folds formed therein, not by use of a frame, has the following advantages:

It has no joint between the main body of the cell elements and the frame, and has no need for water proof treatment; thus it is advantageous for water flow thereover. It also does not need material and operational steps for providing the frame, and results in a cost reduction of the installation. It is also lighter than the framed module, and is easy to handle.

Stiffness of the module can be advantageous for joining and overlapping at the construction step; consequently a strong and reliable construction can be made.

When a usual metallic material is used for the back reinforcing plate, it can be set on the building roof just like the usual roofing material. Consequently, reliability of the module as the roofing material can be increased; thereby, popularization of the module can be assured with the interchange ability of the module with the usual roofing material.

The present inventors have developed a solar cell module that includes a solar cell element, a back reinforcing plate, and a durable plastic film for environmental protection.

The protection of the back reinforcing plate by a durable plastic film is required to prevent peeling between the cell elements and the back reinforcing plate, and to protect from the leakage of water from rain.

There were observed the following problems in such a solar cell module, which is composed of solar cell elements and a back reinforcing metal plate and with integrally applied plastic processing.

At first, the filler within the module tends to be cracked at the folded portions, the filler being used to protect the cell elements and because the folding work creates large stresses in the folded portion peripheral of the filler material. This cracking causes problems not only to the appearance of the module but also deterioration of the cell elements due to the leakage of water through the cracked channel reaching to the cell elements. There is also the problem that the protection film tends to crack.

Usually a filler holder is embedded in the filler material of the solar cell module, and the peeling occurs between the filler material and the holder; the holder is torn because of the bending strain and the folded portion is subjected to whitening. This whitening also gives rise of problems not only in the appearance of the module but also deterioration of the elements caused by the flow of water. The filler holding material is embedded to protect the solar cell elements, it also prevents hot filler leakage during the laminating step of the solar cell modules under heat and vacuum, and it also guides the air to the outside of the module during the defoaming under heat and vacuum.

For these problems, the present inventors proposed, in JP-A 7-131048, a method in which the holder is removed from the folded portion. However, even this means is not satisfactory for producing solar cell modules commercially because of the following problems.

Elastic material that can absorb mechanical shock is used for the filler to protect the solar cell element. The filler tends to return to the original flat plate shape after the solar cell module is shaped by folding, since the filler cannot be folded because of the elasticity restoration, even after the back reinforcing plate is folded. There is a problem of so-called "spring back", as a result of which the required folding cannot be obtained and an insufficiently sharp angle results. There is also a problem in which the peripheries of the module tend to deform wavelike. These problems occur when a low strength backing plate for reinforcement, for example a thin steel plate, is used.

Referring to FIG. 19, the peeling problem is explained. Peelings occur at the location shown by reference numeral 1905 when solar cell module 1901 is folded towards the side of back reinforcing plate 1902 and the force of elasticity restoration, which is the force of filler 1903 tending to return to the original shape before the folding, exceeds the adhesive strength between filler 1903 and back reinforcing plate 1902.

This peeling problem may occur during the folding, and it also may occur after a long period of outdoor exposure even though there was no problem immediately after the folding. In the case where peeling occurs only in a limited part, the space between the filler and the back reinforcing plate forms a channel for water flow and the electricity generation ability of the solar cell elements deteriorates.

There is also a problem that the presence of thick filler material causes difficulty in the folding of various and complicated bending shapes of the solar cell module.

The bending has problems also for workability.

When a so-called "bender", the most simple bending machine that bends material placed between a blade and a mold, is used, it is necessary to lift the blade up and down for every bending operation; it is time consuming and makes cost reduction difficult. This problem is more severe for solar cell modules that have many folded parts. When the module has an elongated dimension along the folding side, it is necessary to use a blade and a mold that are longer than the dimension, and the necessary large power makes the bending difficult.

There is also a problem when a molder usually called a "roll molder" is used to fold the solar cell elements for the purpose of avoiding the problem associated with the use of the bender.

By referring to FIGS. 20–22, roll molders are explained.

The modules are molded step-by-step in several stages between the upper and lower molding rollers. Various shapes of the rollers are used for the roller molding.

FIG. 20 shows a schematic front view of upper and lower molding rollers.

The module material to be molded 2001 is placed between the upper roller 2002 and lower roller 2003, as shown in FIG. 20, and molded. The rollers have the function of transporting the module material 2001 at a constant speed in addition to the function of bending. The rollers also have the function of making necessary adjustments.

FIG. 21 is a schematic drawing of a group of the upper and lower rollers.

The module material is transported from the right side to the left side of the figure, and molded gradually. Complex and good molding is possible when the number of rollers is larger, since the molding step can be divided into many stages.

FIG. 22 explains the molding process in the roller molding.

The material is processed gradually in many steps as shown in FIG. 22 and molded to the final shape.

The merits of this molding method are that the complex cutting face of the mold can be made in one series of processing, it is possible to make a folding mold having the long shape of the solar cell module, and it is also possible to mold materials in good surface condition, with good shape and size precision.

However, there is a problem in this method in that cutting and concavities may be formed in the filler when the solar cell module is processed. There is also another problem that the process may cause scarring and cutting of the weather resistant plastic film.

These problems are explained by referring to FIG. 23. FIG. 23 is a schematic front view of the upper and lower rollers and a solar cell module that is in the course of molding. As shown in the figure, the face of the solar cell module 2301 is pressed at the two points 2307, by upper molding roller 2305, when the solar cell module 2301 is folded towards the side of back reinforcing plate 2302. Since the filler is thick and has large elasticity in this part, problems of depression and tearing of the filler occur. Also, the problems of scarring and tearing of the wear resistant plastic film occur at the roller edges. In addition, it is a problem that molding size precision is impaired by the absorption of the molding load by the thick filler.

These are not only problems in the appearance of the finished module, but there also are the problems of cracking and peeling of the filler by concavities and cuts in the filler; the scars or damage to the filler may deteriorate the performance of the solar cell module by water penetration along the peeling and damage of the weather resistant film. It is necessary to increase the roller pressure in order to get sufficient folding effect of the rollers, because the pressure tends to be absorbed by the filler; and the high pressure also deteriorates the performance of the solar cell element.

As described above, the conventional method of shaping a solar cell module by folding is difficult and unreliable; thereby, deterioration of the solar cell modules has occurred in long term service.

SUMMARY OF THE INVENTION

An object of the present invention is to provide a solar cell module that is excellent in foldability and in durability.

The present invention is to solve the problems explained above and to attain the object mentioned above by a solar cell module comprising a weather resistant film, solar cell elements, a filler for encapsulating the solar cell elements, and a back reinforcing plate, characterized by the non-generating area having a flat plane area containing a thinner filler than the generating area, and that folding is applied to the flat plane area containing the thinner filler.

It is preferable that the filler thickness of the flat plane area containing the thinner filler mentioned above is not less than 5 μm and not more than 1000 μm.

It is further preferable that a material for holding the filler is buried in the filler and that the flat plane area containing the thinner filler does not have a buried material for holding the filler.

It is further preferable that the material for holding the filler is a non-woven fabric or a woven fabric.

It is further preferable that the non-woven fabric or woven fabric is a ceramic non-woven fabric or woven fabric, a glass non-woven fabric or woven fabric, or a polypropylene non-woven fabric or woven fabric.

It is further preferable that the weather resistant film is a non-oriented film.

It is further preferable that the back reinforcing plate is a metal plate.

It is further preferable that the solar cell elements are bendable.

It is further preferable that the solar cell elements are amorphous silicon solar cell elements having, on a conductive substrate, a metallic electrode layer, an amorphous silicon semiconductor layer, a transparent conductive layer, and a grid electrode.

It is further preferable that the solar cell elements are amorphous silicon solar cell elements connected in series with plural amorphous silicon solar cells that have, on a conductive substrate, a metallic electrode layer, an amorphous silicon semiconductor layer, a transparent conductive layer, and a grid electrode.

It is further preferable that the folding is made by using a roll molding machine.

The solar cell according to the present invention has durability against external environmental conditions such as temperature, humidity, wind, and rain since the weather resistant film protects the module.

Durability against external environmental conditions such as temperature, humidity, wind and rain is also afforded by the filler that encapsulates the solar cell elements, which also protects the solar cell from mechanical impacts.

Strength as a structure is maintained by the back reinforcing plate and by the folding. Thereby, a frame body is now unnecessary, which makes the module light and the cost reduced. Fixed installation is possible by using the folded part.

Since the fold shaping is applied at the flat area where the filler is thin, the amount of filler is reduced; thereby, bending strain is decreased and peeling between the back reinforcing plate and the filler is prevented. Also, the problem of spring back, in which the required bend angle is not obtainable and only an insufficiently sharp angle is attained, is overcome since the elasticity restoration of the filler is decreased. The problem of wave formation at the edge of a solar cell module when folded near the edge of the solar cell module is also avoided.

In addition, the problems of cutting and collapsing occurring in the weather resistant film and filler when folded by a roll molding machine are also avoided. The pressure applied to solar cell elements is reduced since the pressure on the presser roll of the roll molding machine is mitigated. Furthermore, the amount of filler to be used is decreased, which contributes to cost reduction.

The present inventors have studied the effect of the thickness of the filler by evaluating the folded part, in which evaluation test samples are prepared and allowed to bend.

At first, the filler thickness at the folded part was varied to 1 μm, 5 μm, 10 μm, 100 μm, 500 μm, 1000 μm, 1500 μm, and 2000 μm, for preparing test samples of the solar cell module.

The experimental samples were made as follows. Fillers in sheet form of 1000 μm thickness were laminated on and under the solar cell elements. For the samples of filler thickness of 1 μm, 5 μm, 10 μm and 100 μm, the filler was coated onto the back reinforcing plate. For the samples of filler thickness of 500 μm, 1000 μm, 1500 μm and 2000 μm, filler in sheet form of 500 μm thickness is laminated in required number of the sheet. In this way, the filler lamination of the folding area was made. These fillers and solar cell elements were inserted between a rectangular back reinforcing plate and a weather resistant film; a vacuum laminator was applied and the fillers were melted at 150° C. Solar cell modules were thus prepared.

EVA (ethylene-vinyl acetate copolymer) was used as the filler.

The experimental samples, prepared in this way, were subjected to folding (bending) by a roll molding machine, and the appearance thereof was evaluated. The shape of folding was: the solar cell module was pulled down vertically by 1 cm along the lengthwise direction to the back reinforcing plate side. Table 1 shows the result.

Durability of these samples against the change of temperature was evaluated by visual observation of the folded part after 50 times repetition of a test cycle condition consisting of 40° C. for 1 hour and 85° C. for 1 hour.

TABLE 1

| Filler Thickness (μm) | Folding by Roller | | Folding by Bender | |
|---|---|---|---|---|
| | Initial | After Temperature Change | Initial | After Temperature Change |
| 1 | G | G | G | P (2) |
| 5 | G | G | G | G |
| 10 | G | G | G | G |
| 100 | G | G | G | G |
| 500 | G | G | G | G |
| 1000 | G | G | G | G |
| 1500 | P (1) | P (1) | G | P (2) |
| 2000 | P (1) | P (1) | P (2) | P (2) |

Results obtained by folding using a mold and a knife are also shown in Table 1 for the purpose of comparison. The evaluation criteria are as follows. G (good): No appearance change was observed. P (poor) (1): Cut or concave. P (poor) (2): Peeling between the back reinforcing plate and the filler was observed.

In the sample of 1 μm filler thickness, the adhesive strength of the filler lowered after the varying temperature cycles and peeling between the back reinforcing plate and the filler was observed. It has been found that sufficient adhesive strength requires 5 μm or more film thickness. In the samples of 1500 μm or more filler thickness, cutting of the weather resistant film and filler were observed in most portions along the folding line near but apart from the bent part by the roller molding machine. The folding by the bender also caused peeling between the back reinforcing plate and the filler since the adhesive strength between the back reinforcing plate and the filler was insufficient compared to the elasticity restoration of the filler and weather resistant film. It has been found that the filler thickness should be not more than 1000 μm for the rolling work on the surface of the solar cell module without trouble and for preventing peeling of the filler.

As found, the problems mentioned before are surely solved by making the filler thickness, in the thinner flat area of the mentioned filler, not less than 5 μm and not more than 1000 μm.

In addition, by not burying the material for holding the filler, the solar cell element parts are protected by the filler holding material, flow out of the filler is prevented at an elevated temperature when the solar cell modules are laminated under vacuum and heat, the air remaining in the solar cell module is exhausted to the outside, and the problems causing deterioration of the solar cell module are avoided, including white turbidity of the folding part brought by peeling between the filler and the filler holding material and their cutting and the water flow therein.

Since the material for holding the filler is non-woven fabric or woven fabric, high light transmittance, high porosity, and high strength result. Flow out of the filler is further prevented at an elevated temperature when the solar cell modules are laminated under vacuum and heat, and the air remaining in the solar cell module is further exhausted to the outside. Decrease of the incident light is also kept at a minimum.

When the non-woven fabric or woven fabric is ceramic non-woven fabric or woven fabric, glass non-woven fabric or woven fabric, or polypropylene non-woven fabric or woven fabric, high light transmittance, high porosity, and high strength are provided. Thereby, sufficient protection against scratches and impacts to the solar cell module results. With the high light transmittance, the incident light decrease is at a minimum. Deterioration and discoloration for a long period of time are inhibited, and disadvantageous effects are prevented. Since the solar cell modules are not deteriorated when they are laminated under vacuum and heat, flow out of the filler is prevented at an elevated temperature in this process and the ability to exhaust the remaining air in the solar cell module outside is further enhanced.

Furthermore, when the weather resistant film is a non-oriented film, elongation of the weather resistant film is large, and the problem of breaking the weather resistant film in the step of folding is minimized. The non-oriented film also accommodates the variation of the filler from the thick parts to the thin parts, and cutting or wrinkling therefore does not occur even for a solar cell module in which the thickness varies significantly.

Furthermore, when the back reinforcing plate is a metal plate, necessary strength as a structure and excellent workability result. Excellent durability for outdoor use is secured thereby. Since metal plates have been conventionally used as roof materials, the convertibility therebetween is obtained. When the solar cell elements are bendable, the problem of cracking of the solar cell elements is avoided, and the thickness of the solar cell module can be made thin since limited rigidity is required, which contributes to making the weight small and the cost reduced.

When the solar cell elements are amorphous silicon solar cell elements having, on a conductive substrate, a metallic electrode layer, an amorphous silicon semiconductor layer, a transparent conductive layer, and a grid electrode, thin solar cell elements can be manufactured inexpensively; less thick solar cell modules contribute to reduction of the weight and cost.

When the solar cell elements are amorphous silicon solar cell elements connected in series with plural amorphous silicon solar cells that have, on a conductive substrate, a metallic electrode layer, an amorphous silicon semiconductor layer, a transparent conductive layer, and a grid electrode, manufacture of larger solar cell modules can be possible; thereby, an array of solar cells with a broad area can be constituted with a smaller number of solar cell modules. Required parts and workmanship per module are consequently reduced; thereby, the cost is reduced.

When the folding is applied by using a roll molding machine, fabrication is continuous with high productivity, and the folding is possible in a shorter period and less expensively than the case where a bending machine with a receiver mold and knife is used. Thereby, molding shapes with complicated cross-section is possible, and large and long modules can be manufactured simply.

BRIEF DESCRIPTION OF THE DRAWINGS

FIG. 3 is a cross-sectional schematic view along line 3—3 of FIG. 2;

FIG. 4 is a cross-sectional schematic drawing of an example of the present invention when installed;

FIG. 5 is a schematic drawing of a solar cell module of the present invention;

DETAILED DESCRIPTION OF THE PREFERRED EMBODIMENTS

In the embodiments, the solar cell module 301 is constructed, as shown in FIG. 3, wherein the filler 363 for the non-generating area of the solar cell module is thinner than the filler for the generating area of the solar cell element 304.

Each element of the solar cell module of the present invention is explained hereinafter.

PHOTOVOLTAIC ELEMENT

While there is no limitation on the type of the solar cell elements used for the present invention, it is preferable that the solar cell is bendable. It is further preferable that an amorphous silicon semiconductor layer is formed on a stainless steel substrate. Since the thickness of an amorphous silicon semiconductor layer formed on a stainless steel substrate can be made as thin as about 0.1 mm, the amount of the filler for solar cell elements can be reduced. Since the amorphous silicon semiconductor layer formed on the stainless steel substrate is bendable and the solar cell is difficult to damage, it is easy to treat and its workability can be excellent. Since the weight of the solar cell element can be reduced with a stainless steel substrate, the thickness of the back reinforcing plate can be reduced, and the material cost can be reduced as a result.

Figure 12:
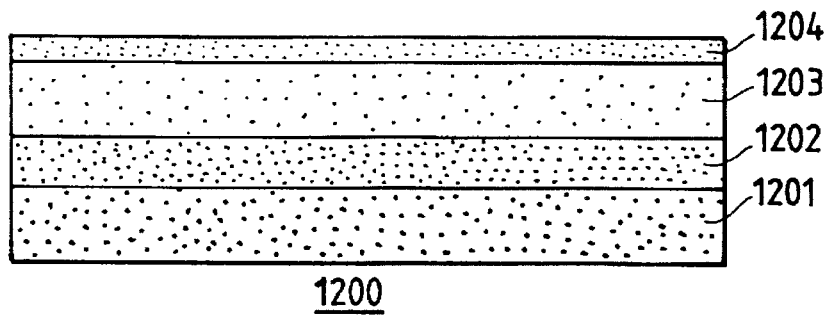
FIG. 12 is a cross-sectional drawing of a solar cell element of a solar cell module of the present invention.

FIG. 12 is a schematic cross-sectional view of one embodiment of a solar cell element used for a solar cell module of the present invention. In FIG. 12, reference numeral 1201 designates a substrate, 1202 designates a back reflecting layer, 1203 designates a semiconductor layer as a photoelectric converting element and 1204 designates a transparent conductive layer.

The conductive substrate 1201 can be the back reflecting layer 1202.

While the above substrate 1201 is not limited, a conductive substrate is preferable in consideration of its bendability and high impact resistance. Examples of conductive substrates include stainless steel, aluminum, copper, titanium, carbon sheet, steel; and resin films such as polyimide, polyester, polyethylene naphthalide, and epoxy, having a conductive layer thereon; and ceramics.

While the material of the semiconductor layer 1203 is not restricted, semiconductors such as an amorphous silicon semiconductor, a polycrystalline silicon semiconductor, a crystalline silicon semiconductor, and copper indium selenide are suitable. For the case of amorphous silicon semiconductor, it is formed using plasma CVD of silane and other gases. Polycrystalline silicon semiconductors are formed from molten silicon sheets or by heat treatment of amorphous silicon semiconductors.

As for the semiconductor layer structure, pin junctions, pn junctions or Schottky type junctions are usable. The semiconductor layer is sandwiched between the back electrode layer 1202 and the transparent conductive layer 1204. For the back electrode layer 1202, a metallic layer, metallic oxide, or a laminated layer of a metallic layer and a metallic oxide layer may be used.

For the material of the metallic layer, Ti, Al, Ag or Ni may be used. For the metallic oxide layer, ZnO, $TiO_2$, or $SnO_2$ may be employed. For forming the above metallic layer and metallic oxide layer, resistance heating evaporation, electron beam evaporation, sputtering, spraying or CVD may be used. Furthermore, as for the material of the grid electrode for collecting the current effectively generated by the photoelectromotive force on the transparent conductive layer, Ti, Cr, Mo, W, Al, Ag, Ni, Cu, Sn or conductive paste such as silver paste may be used, but the material is not limited to these. For forming the grid electrode, the following methods may be used: sputtering with a masked pattern, resistance heating, CVD or other vapor deposition, etching and patterning after evaporating a metallic layer over the entire surface, direct forming of the grid electrode pattern by optical CVD, forming by plating after forming a negative mask pattern of the grid electrode, and forming by printing conductive paste. As for the conductive paste, a fine powder of Au, Ag, Cu, Ni, or carbon which is distributed with a binder polymer, are generally used. Examples of the above binder polymer include resins of polyester, epoxy, acryl, atkyd, polyvinyl acetate, rubber, urethane, and phenol.

For the material of the bus bar to further collect and transport the current collected by the grid electrode, copper or nickel which are tinned or solder coated are used. The bus bar is connected to the grid electrode by using conductive adhesive or solder.

When a back reinforcing plate other than metallic plates is used, a solar cell module which has excellent foldability, as good as in the other embodiments, can be formed, by directly forming an amorphous silicon semiconductor layer on a back reinforcing plate made of insulated material, forming a non-generating area in the folded portion using laser scribing, and forming the area which contains the thinner filler on the folded portion.

BACK REINFORCING METAL PLATE

It is preferable that the back reinforcing plate has structural stiffness caused by shaping by folding. Preferably the back reinforcing plate has bendability, excellent workability, strong adhesive ability with the filler layer, high weather resistance, and corrosion resistance. Its gradation of color is preferred to be selectable because it may affect the outside view according to the installation conditions. It is preferable that the back reinforcing plate is metallic. More specifically, examples of the metal plate include copper plate, aluminum alloy plate, titanium plate, stainless steel plate, zinc-galvanized steel plate, zinc-aluminum-galvanized steel plate and other specially galvanized steel plates, and laminated and coated steel plates. It is preferable that the metallic plate is colored by a paint of polyester resin type or epoxy resin type.

WEATHER RESISTANT FILM

It is preferable that the weather resistant film has high weather resistance. Preferably it has water repellency to prevent contamination. Preferably its elongation is high because of the need of responding to the variation from thicker filler area to thinner filler area, and because of the necessity of folding the back reinforcing plate without tearing. Examples of the weather resistant film include fluororesin films. Copolymer films of non-extended-type ethylene-tetrafluoroethylene are more preferable.

For the purpose of securing adhesion with the filler layer, a process for enhancing the adhesion, such as a corona discharge process or ozone treatment, is preferable. A non-extended type film is preferable.

As for the weather resistant film of the solar cell module used for the present invention, its elongation is preferably high so as not to crack at the folded position when folded. Cracking of the weather resistant film is not desirable, and it may also cause film peeling.

FILLER FOR BURYING PHOTOVOLTAIC ELEMENT

The filler for encapsulating the photovoltaic element is preferred to have excellent workability because shaping by folding is applied to the solar cell module. It is preferable that the incident side is transparent to the light that is used for the photoelectric generation. The adhesion and stickability are preferred to be high with the back reinforcing plate, the photovoltaic element, and the weather resistant film. The filler is preferred to be a thermoplastic resin for the purpose of filling concavities and convexities of the photovoltaic element.

Copolymers of ethylene-vinyl acetate (EVA), copolymer resin of ethylene acrylate (EEA), polyvinyl butyral (PVB), silicone resin, and acrylic resin are preferable examples of the filler. A cross-linking agent and thermal oxidation inhibitor may be added to the filler for improving the heat resistance. The filler that is placed on the back side of the photovoltaic element need not be transparent. Different types of fillers may be used, depending on their locations such as the incident side of the photovoltaic element or the backside, or depending on the presence or absence of the photovoltaic element. A filler holding material, in a form of sheet, of woven fabric or non-woven fabric such as glass and polypropylene may be included within the filler.

FILLER HOLDING MATERIAL

The filler holding material used in the present invention is for the purpose of preventing the filler from flowing out when the filler temperature is elevated, and protecting the solar cell elements. The filler holding material also functions for exhausting remaining air in the solar cell module to the outside when the solar cell module is defoamed under vacuum and heat.

Preferable filler holding materials used for the present invention are of high transparency, porosity, and stiffness. More specifically, preferable filler holding materials are woven fabric or non-woven fabric of glass, ceramic, or polypropylene

SURFACE SHAPE OF THE MODULE

Before the fold molding process, the back reinforcing plate and the weather resistant film are approximately face-to-face in parallel. In the space between the back reinforcing plate and the weather resistant film, it is necessary that the filler should be thicker and the distance should be long to protect the solar cell element in the area where the solar cell elements are present, and that the filler should be thinner and the distance should be short so as to provide higher workability and reliability at the folded area after the folding is done. For this purpose, the weather resistant film of the solar cell module surface must be continuous from where the filler is thicker to where the filler is thinner. For this purpose, a weather resistant film with high elongation should be used. Thus, the angle of the transition area where the thickness of the filler changes is arbitrary. For this reason, the weather resistant film should have large elongation. Both a sharp continuity or a smooth continuity may be allowed in the solar cell module.

The thinner filler part can exist not only at the edge but also at any part. For example, for the case of an approximately rectangular solar cell module, the thickness of the filler in the lengthwise direction may be reduced not only at the edge but also at all the edges. Other than the edge part, in the center part where the solar cell element does not exist, the filler may have reduced thickness. For performing the roll molding without trouble, it is preferable that the thinner part of the filler has some width along the folding direction in the vicinity of the folding part where the roller is applied. It is preferable that the thickness of the filler of the flat area where the filler is thinner is not less than 5 µm and not more than 1000 µm.

PREPARATION METHOD OF THE MODULE

To fabricate the area where the filler is thinner in the solar cell module, it is necessary to reduce the amount of the filler to be laminated when the various materials are laminated. To get the required shape, it is necessary to push the mold for restricting the flowing out of filler. If the angle of the transition area where the filler thickness is to change smoothly, the desired shape is obtained by flowing out the filler from its thicker part to its thinner part, without any jig in the assembly. The surface and the corner of the board-like pressing jig are to be treated to have smooth surface for not scratching the weather resistant film. The amount of the filler to be laminated and the thickness of the pushing jig are determined so as not to cause wrinkling by slacking of the weather resistant film.

Figure 17:
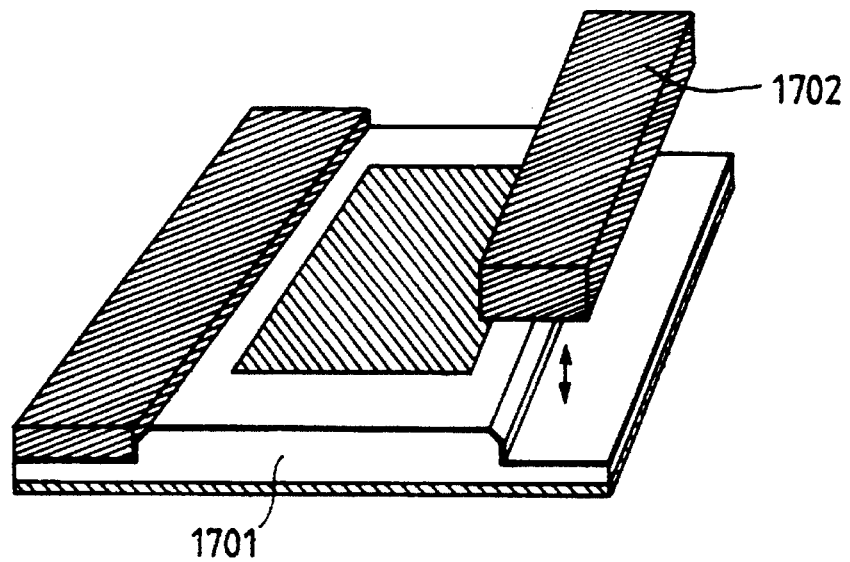
FIG. 17 is a schematic drawing showing an example of a filler used in the thin part in the present invention.
Figure 18:
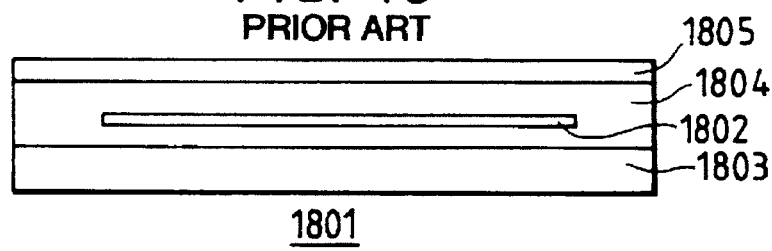
FIG. 18 is a schematic cross-sectional drawing of a conventional solar cell module.
Figure 19:
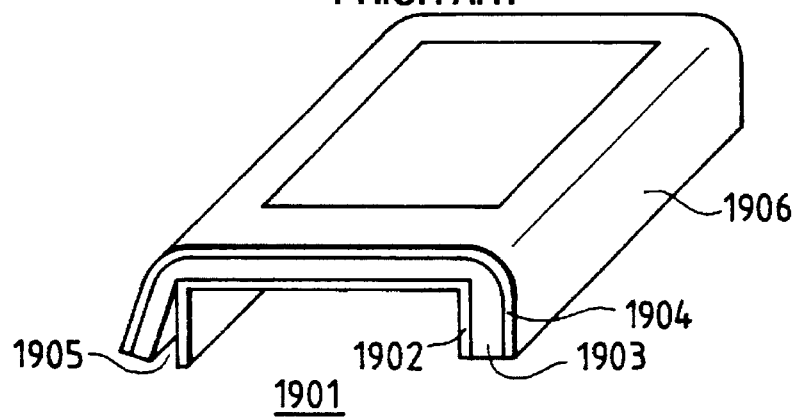
FIG. 19 is a drawing illustrating problems in the forming of a conventional solar cell module.
Figure 20:
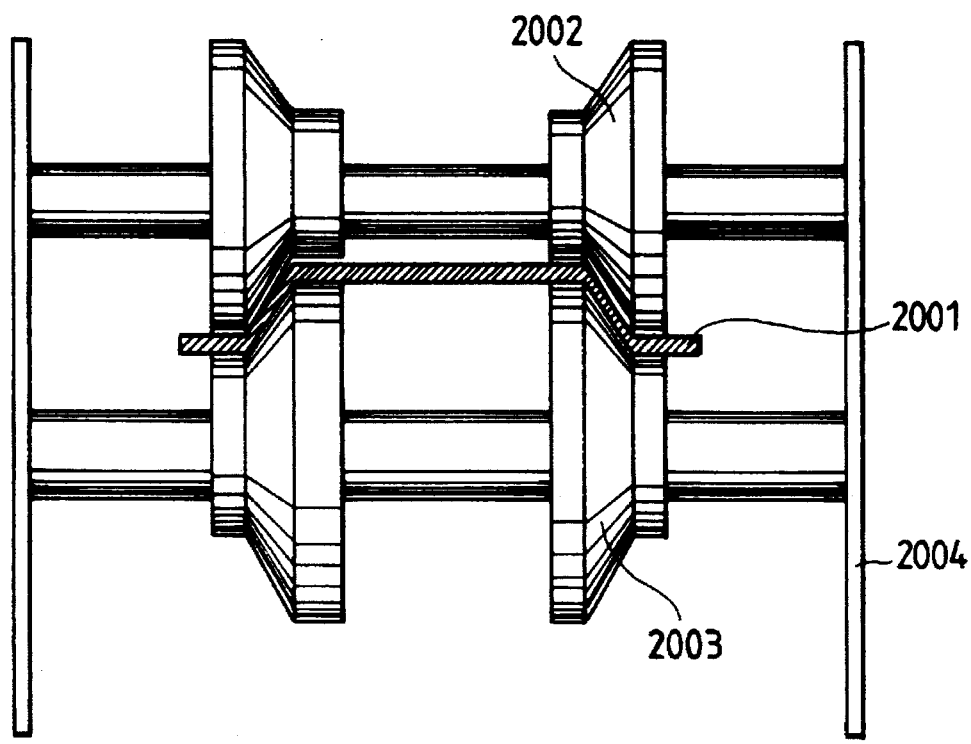
FIG. 20 is a front view of upper and lower molding rolls.
Figure 21:
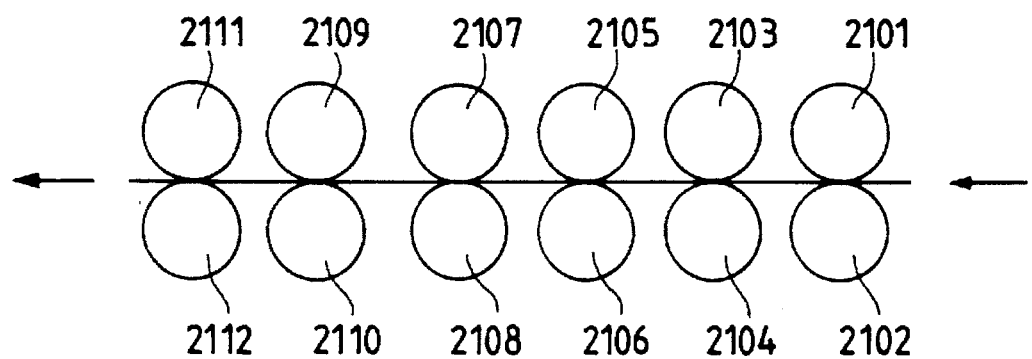
FIG. 21 is a schematic drawing of molding rolls' group.
Figure 22:
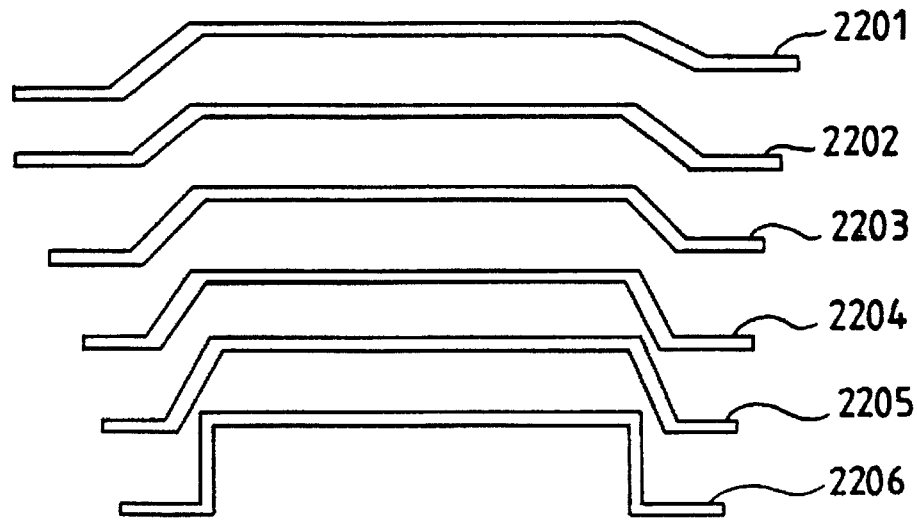
FIG. 22 is a flow chart of molding steps by rolls.
Figure 23:
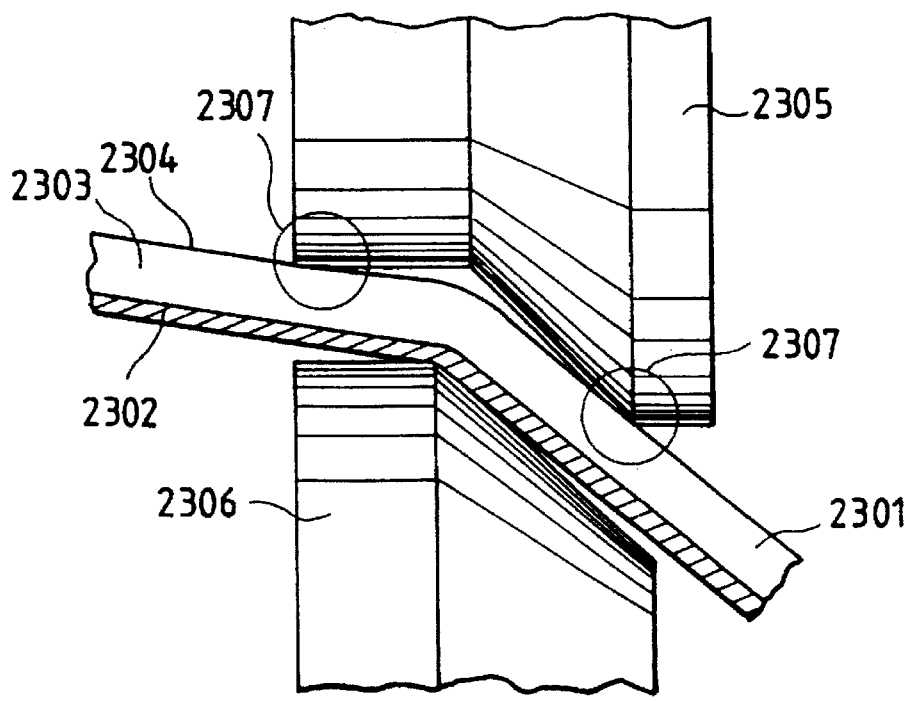
FIG. 23 is a front view of upper and lower molding rolls.

An example for forming the thinner filler part, mentioned above, of the solar cell module is explained by referring to FIG. 17. When laminating the constituent materials, the amount of filler to be laminated in the thinner filler part is made smaller than the generating area, for the purpose of increasing the flatness and uniformity of the filler. The bar-shaped jig 1702, which pushes the thinner part for forming a sharp step in the transition region from the thicker filler part to its thinner part, is placed on the incident side of the weather resistant film; thereafter, the filler is melted using a vacuum laminator. The sharp step is formed in this way. Moreover, the thickness of the thinner filler part can be made thinner by making the pressing jig 1701 thicker and decreasing the filler volume accordingly. Furthermore, by making the pressing jig 1701 thinner and increasing the filler volume accordingly, the thickness of the thinner filler part can be less thin. In this way, the thickness of the thinner filler part is adjustable.

PLASTICITY PROCESSING

While there is no limitation for the folding method of the solar cell module, it is preferable that the folding is done using a roll forming machine. In this case, preferably, a soft roller such as of urethane resin, avoiding a metal roller, is used for not scratching the weather resistant film. The roller angle R should be as large as possible. The roller transport speed should be slow for minimizing damage and dimensional error.

The surface of solar cell module is generally a weather resistant film such as of urethane resin, which is susceptible to surface damage. Hence, the mold of the "folding machine" or "bender" is preferably of a material that does not damage the surface of the solar cell module. For example, the weather resistant film surface of a solar cell module is placed on a soft mold of urethane resin and the blade is applied to the back reinforcing plate; in this way, folding is made without damage.

The present invention is now described in detail by way of examples; however, the present invention is not limited thereby.

EXAMPLE 1

This example relates to a case, in which a solar cell module that had amorphous silicon solar cell elements, prepared and connected serially on a stainless steel substrate, and had a zinc-galvanized steel back face sheet was subjected to folding.

First, an amorphous silicon solar cell element (FIG. 12) was prepared as follows.

By sputtering, a 5000 Å thick film 1202 of Al containing 1% Si was formed on a cleaned elongated stainless steel substrate 1201 of 0.1 mm thickness in a roll form. Next, n/i/p type amorphous silicon semiconductor layers 1203 were sequentially formed by plasma CVD method as follows: an n-type semiconductor layer of 300 Å thickness was formed using $P_3$, $Si_4$, and $H_2$ gases; an i-type semiconductor layer of 400 Å thickness using $SiH_4$ and $H_2$ gases; and a p-type semiconductor layer of 100 Å thickness was formed using $B_2H_6$, $SiH_4$, and $H_2$ gases. Then, an ITO layer 1204 of 800 Å thickness was formed by resistance heating vapor deposition method to form an amorphous silicon solar cell element 1200.

Figure 13:
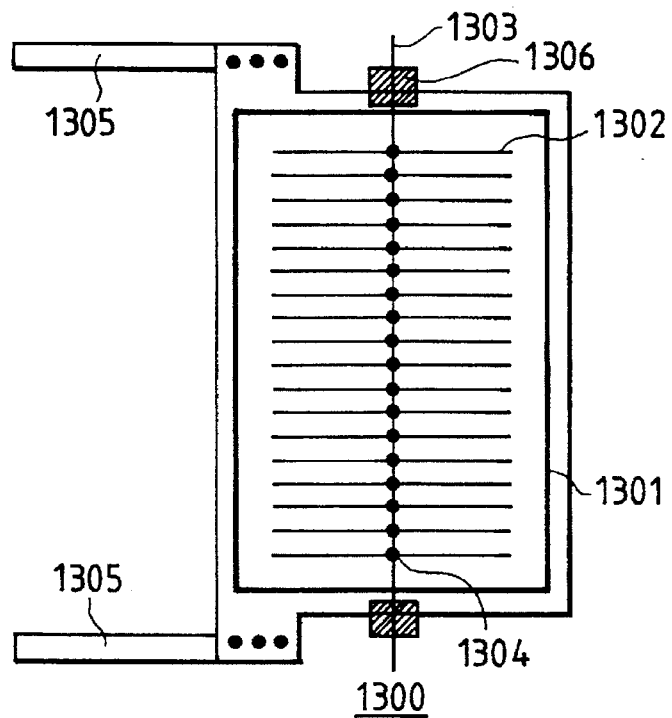
FIG. 13 is a schematic drawing showing the constitution of an a-Si solar cell element of the present invention.
Figure 14:
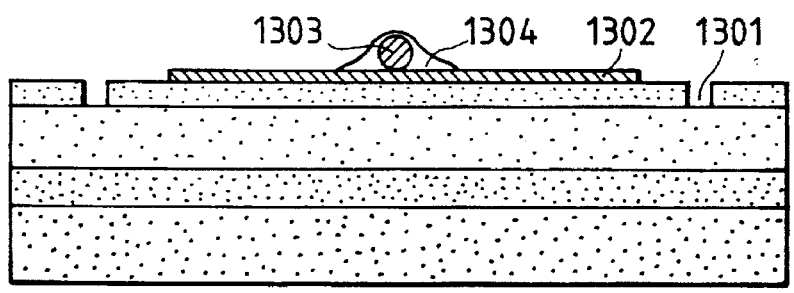
FIG. 14 is a cross-sectional drawing of an a-Si solar cell element of the present invention.

Second, the long solar cell element mentioned above was cut by a press machine to make a plurality of solar cell elements, each being of the size of 30 cm×15 cm as shown in FIG. 13. In the cut surface of the solar cell elements, cut by the press machine, the solar cell elements were crushed by the press machine; thereby, the ITO electrode and stainless steel substrate were in a short-circuit condition. For the purpose of repairing this short-circuit, the peripheral areas of the ITO electrode of each solar cell element were removed. Removal of the peripheral areas of the ITO electrode was done by screen-printing an etching agent ($FeCl_3$ solution) on the peripheral areas of ITO located slightly inside the cut surface of each solar cell element to dissolve the ITO and followed by cleaning the areas with water; the etching agent (FeCl$_3$ solution) selectively dissolved the ITO but not the amorphous silicon semiconductor. Thus, the ITO electrode 1301 was formed.

Third, collecting grid electrodes 1302 were formed on the ITO by screen-printing a silver paste containing polyester resin as the binder (made by DuPont Company, [5007]). A tin-coated copper wire 1303, which is the collecting electrode of the grid electrodes was placed crossing perpendicularly with the grid electrodes. An adhesive silver ink 1304, which was "C220" made by Emerson & Cuming, Inc., was dripped on the cross points of the wire and grid electrodes and dried at 150° C. for 30 minutes to connect the tin-coated copper wire with grid electrodes. At that time, a polyimide tape was pasted to the lower side of the tin-coated copper wire 1303 to assure no contact between the end surfaces of stainless steel substrate and the tin-coated copper wire.

Fourth, the ITO layer/α-Si layer at the non-generation areas of the amorphous silicon solar cell element were removed by a grinder so that the stainless steel substrate could be exposed and welded to copper foils 1305 by a spot welder.

Figure 15:
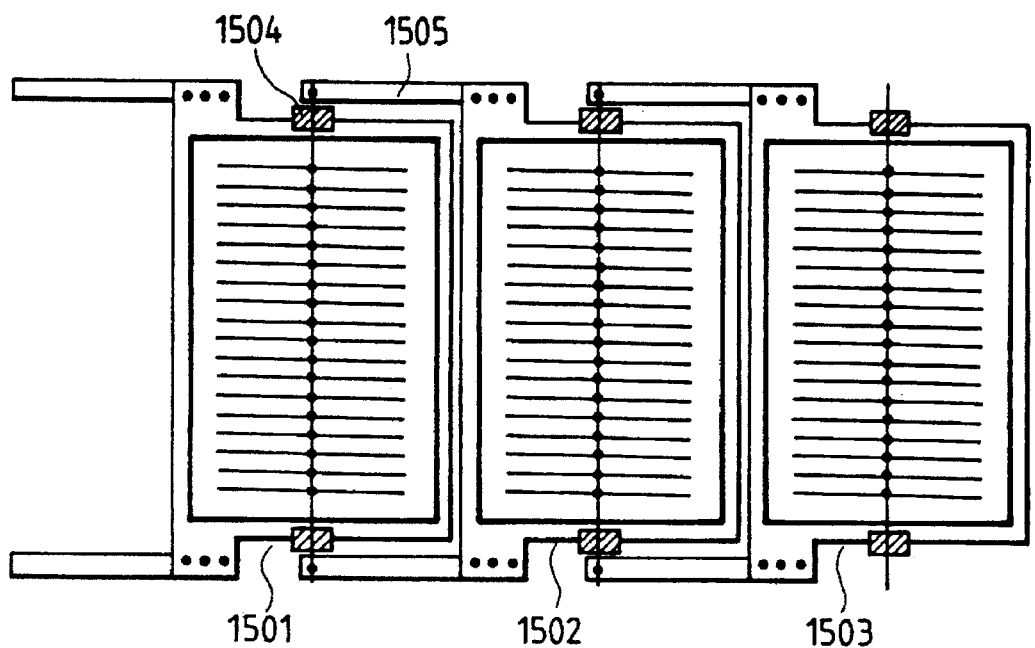
FIG. 15 is a series connection diagram of an a-Si solar cell element of the present invention.

Fifth, as shown in FIG. 15, the tin-coated copper wire 1504 of solar cell element 1501 and the copper foil 1505 of solar cell element 1502 were serially connected by soldering. Likewise, the tin-coated copper wire of the solar cell element and the copper foils of adjacent solar cell elements were serially connected by soldering so that 13 solar cell elements were serially connected.

Wiring for positive and negative terminal connections was made on the backside of the stainless steel substrate.

Figure 16:
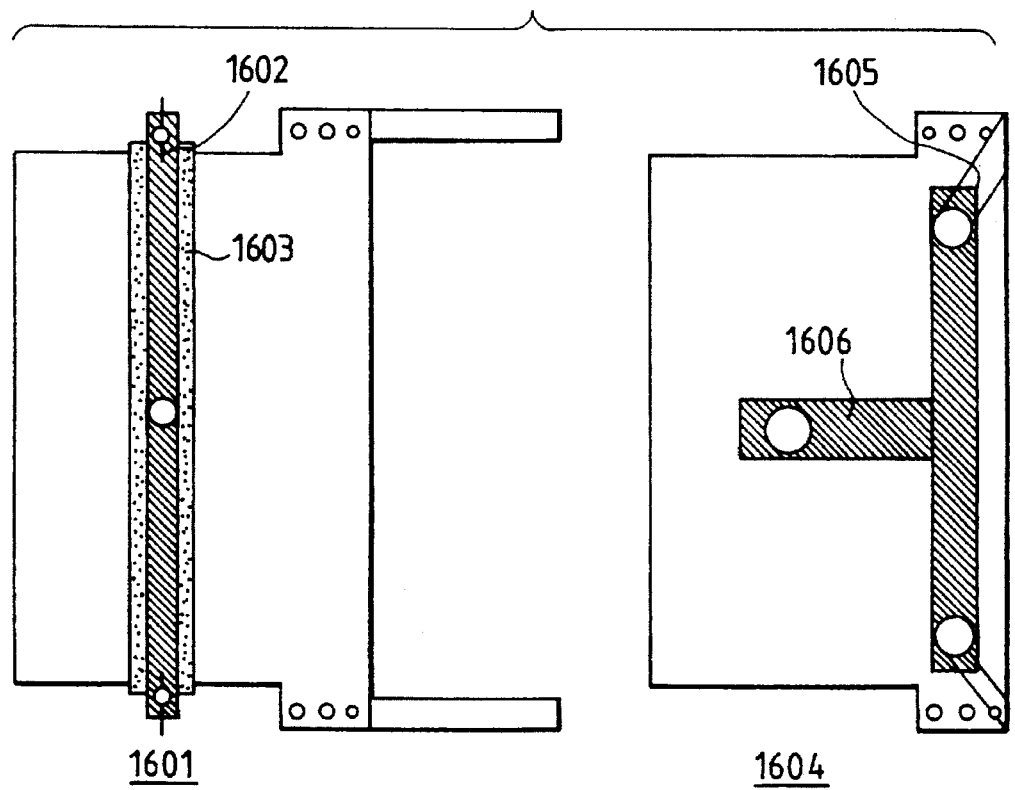
FIG. 16 is a back side wiring diagram of a solar cell module of the present invention.

FIG. 16 shows the backside wiring diagram of the solar cell elements connected serially. Insulating polyester tape 1603 was first pasted on the middle part of the 13th solar cell element 1601. Copper foil 1602 was then pasted on it. The positive side wiring was then done by soldering copper foil 1602 with the tin-coated copper wire. After copper foil 1606 was connected to the 1st solar cell element 1604 as shown in FIG. 16, the negative side wiring was completed by soldering copper foil 1605 that was spot-welded to the 1st solar cell element 1604.

Sixth, solar cell module 301 containing solar cell elements 304 that was sealed with resin and held between zinc-galvanized steel sheet 302 and non-oriented fluororesin film 305, as shown in FIG. 3, was prepared by the following procedures: galvanized sheet steel 302 of 0.3 mm thickness/ EVA 303/solar cell elements 304 consisting of 13 serially connected cells explained above/EVA 303/non-oriented copolymer film 305 of ethylene tetraethylene and fluororesin "AFLEX" (Asahi Glass Company) of 50 μm thickness/a jig for compressing the EVA so that it forms a uniform and thin film at the thinner filler portion, were sequentially laminated in this order. Solar cell module 301 was then produced by using a vacuum laminator to melt the EVA at 150° C. At that time, the amount of EVA laminated at the thinner filler portion was relatively smaller than at the thicker filler portion. The compression plate jig used was a steel sheet of 1.5 mm thickness. The amount of filler at the thinner filler portion was ¼ that at the generating area. Thereby, the solar cell module produced had a filler of 2 mm thickness at the generating area and a filler of 0.5 mm thickness at the thinner filler portion.

The surface, to be adhered, of non-oriented fluororesin film 305 was preliminarily plasma-treated for better adhesion with EVA 303. Solar cell elements 304 serially connected in this procedure were of a size smaller than the backside galvanized steel sheet and the non-oriented fluororesin film 305 so that the end portions of solar cell module 301 could be folded at a later process.

Figure 1:
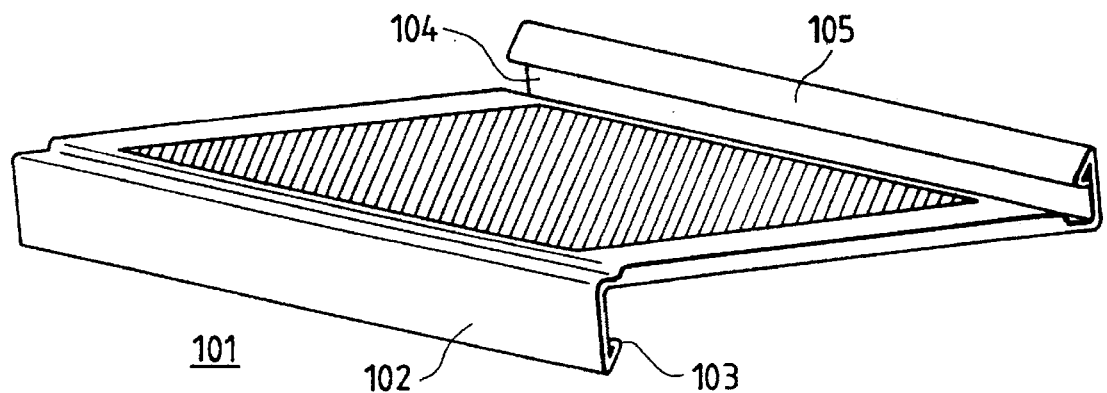
FIG. 1 is a schematic drawing of a solar cell module of an embodiment of the present invention.
Figure 2:
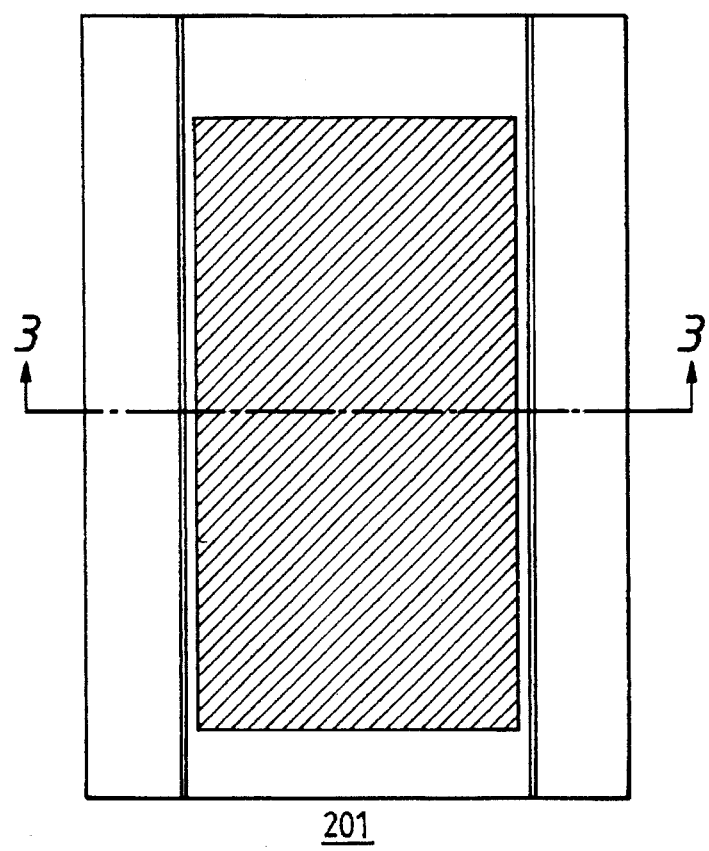
FIG. 2 is a top plan view of a solar cell module of an embodiment of the present invention.

Seventh, the above-mentioned solar cell module 301 was subjected to folding into the shape as shown in FIG. 1 by a roller former.

The downwardly facing engagement portion was made by folding one of the ends perpendicularly as shown by reference numeral 102 and then by folding it at an acute angle into the inside direction twice as shown by reference numeral 103. The rising engagement portion was made by folding the other end portion upwardly at 90 degrees to the direction of the solar cell side as shown by reference numeral 104. It was again folded at an acute angle as shown by reference numeral 105. Finally, it was once more folded at an acute angle as shown by reference numeral 105.

FIG. 4 shows the engagement (seam) and gripping between the rising engagement portion 105 and the downwardly facing engagement portion 103 of an adjacent solar cell module.

FIG. 4 shows a schematic cross-sectional drawing when a plurality of the solar cell modules of this example were installed on sheathing roof boards. Solar cell module 401 has both rising end 404 and downward facing end 402, each end respectively having an engagement portion, 405 and 403. The engagement portions of the two vertically adjacent modules are gripped with each other (seamed). The solar cell module was installed on a supporter 406 by fixing the upward facing end with a fixing member 407.

Joints were used to connect a solar cell module with another adjacent solar cell module located in the direction where no folded ends were available.

Filler at the engagement portion of this example was so thin or the portion was so close to roofing materials commonly used that its folding and installing were done with the same degree of ease as handling of conventional roofing materials.

This example produced a lighter solar cell module since no frame was used. As a result, handling at the time of installation, for example, was also easier. The material was less expensive.

In addition, no whitening at the bending portion nor cracking of the filler was found. Thus, a solar cell module with good appearance was obtained.

No peeling of the filler and weather-resistant film was observed. Thus, reliability of the folded portion was improved.

Another advantage was smaller possibility of flames going upward through the engagement portion from the inside of the building to the outside or the roof in case of fire due to the thin filler layer of the engagement portion.

EXAMPLE 2

This example is a case of cutting and bending a solar cell module which consists of amorphous silicon solar cell elements prepared and serially connected on a stainless steel substrate with a galvanized sheet iron backside.

Figure 6:
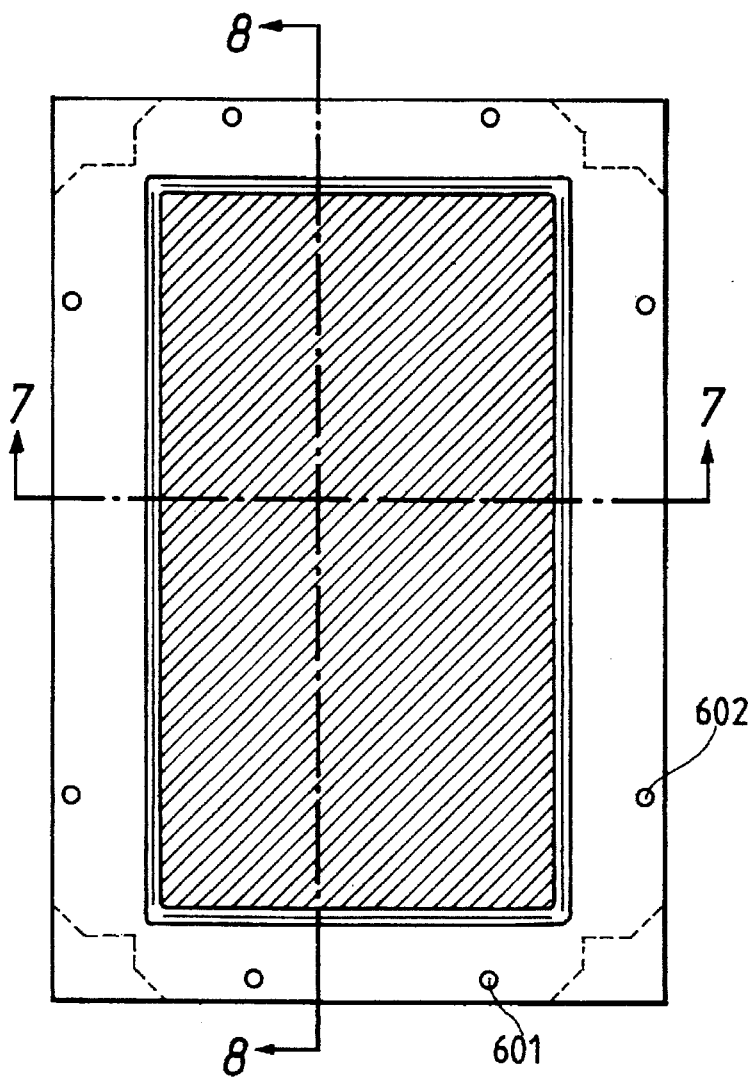
FIG. 6 is a top plan view of the solar cell module of FIG. 5.
Figure 8:
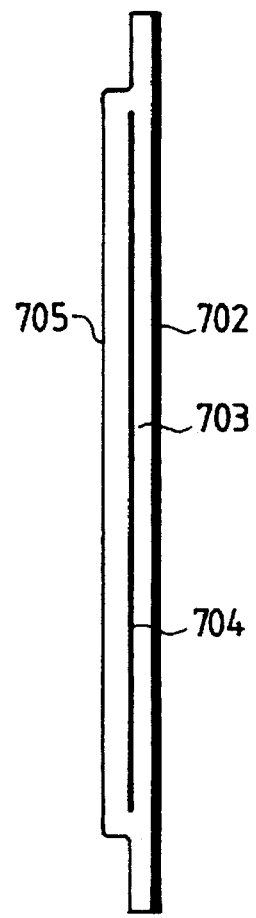
FIG. 8 is a cross-sectional view along line 8—8 of FIG. 6.
Figure 7:
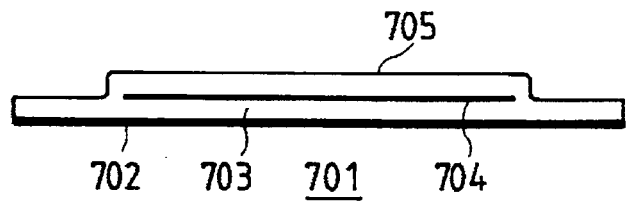
FIG. 7 is a cross-sectional view along line 7—7 of FIG. 6.

In this Example 2, the solar cell elements prepared in the same way as in Example 1 were used. Solar cell module 701 containing solar cell elements 704 that are sealed with a resin and held between zinc-galvanized steel sheet 702 and non-oriented fluororesin film 704 as shown in FIG. 7 were prepared by the following procedures: zinc galvanized steel sheet 702 of 0.3 mm thickness/EVA 703/solar cell elements 704 consisting of 13 serially connected cells/EVA 703/non-oriented copolymer film 705 of ethylene tetraethylene and fluororesin "AFLEX" (Asahi Glass Company) of 50 μm thickness/a jig for compressing the EVA so that the EVA forms a uniform and thin film at the thinner filler portion, were sequentially laminated. Solar cell module 701 was then prepared by using a vacuum laminator to melt the EVA at 150° C. As shown in FIGS. 6, 7, and 8, a thinner film portion exists at all four ends in this example, resulting in good foldability at all four ends.

Here, the amount of EVA laminated at the thinner film portion was relatively smaller than at the thicker film portion. The compression plate jig used was a 1.5 mm thick steel sheet. The amount of filler at the thinner filler portion was ¼ that at the generating area. Thereby, the solar cell module produced had a filler of 2 mm thickness at the generating area and a filler at the thinner filler portion of 0.5 mm thickness.

Then, a corner shear cut all four corners (as shown in dashed lines in FIG. 6), and a bender folded each of the four sides at 90 degrees twice in the direction of the backside to make a box shape. Installation on a supporter was done by screwing through fixing holes 602 from the backside.

In this example, a lighter solar cell module was produced since no frame was used. As a result, the handling for installation was also easier. The material cost, too, was inexpensive.

In addition, no whitening at the folded parts nor cracking of the filler were found. Thus, a solar cell module with good appearance was obtained.

No peeling of the filler and weather-resistant film was observed. In this way, reliability of the folded part was improved.

EXAMPLE 3

This example relates to a case in which many amorphous silicon solar cell elements, prepared and connected serially on a stainless steel substrate, were formed into a solar cell module that had been folded and had a zinc-galvanized steel sheet on the back surface.

Figure 10:
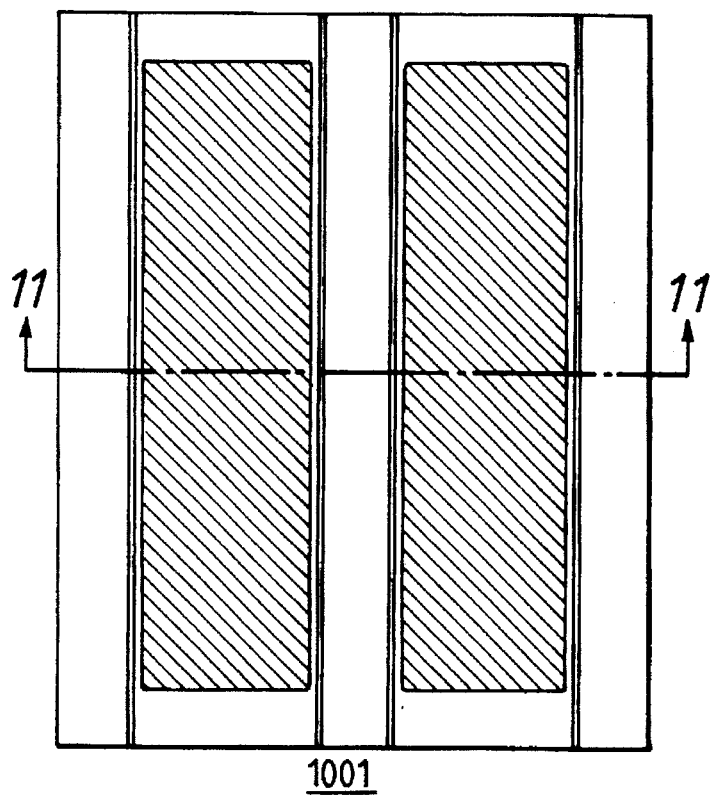
FIG. 10 is a top plan view of a solar cell module of the present invention.
Figure 11:
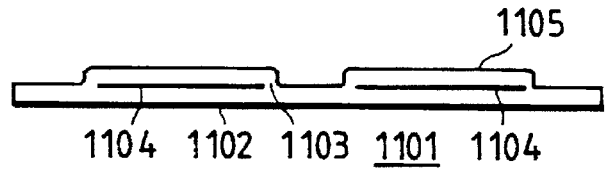
FIG. 11 is a cross-sectional view along line 11—11 of FIG. 10.

In this Example 3, solar cell elements prepared in the same way as in Example 1 were used. Solar cell module 1101 containing solar cell elements 1104 that were sealed with a resin and held between zinc-galvanized steel sheet 1102 and non-oriented fluororesin film 1105 as shown in FIGS. 10 and 11, was prepared by the following procedures: 0.3 mm thick zinc-galvanized steel sheet 1102/EVA 1103/solar cell elements 1104 consisting of 13 serially connected cells/EVA 1103/non-oriented copolymer film 1105 of ethylene tetraethylene and fluororesin "AFLEX" (Asahi Glass Company) of 50 μm thickness/a jig for compressing the EVA so that the EVA forms a uniform and thin film at the thinner filler portion, were sequentially laminated. Solar cell module 1101 was then prepared by using a vacuum laminator to melt the EVA at 150° C. The amount of EVA laminated at the thinner film portion was relatively less than at the thicker film portion. The compression plate jig used was a steel sheet of 1.5 mm thickness. The amount of filler at the thinner filler portion was ¼ that at the generating area. Thereby, the solar cell module produced had a filler of 2 mm thickness at the generating area and a filler of 0.5 mm thickness at the thinner filler portion.

Figure 9:
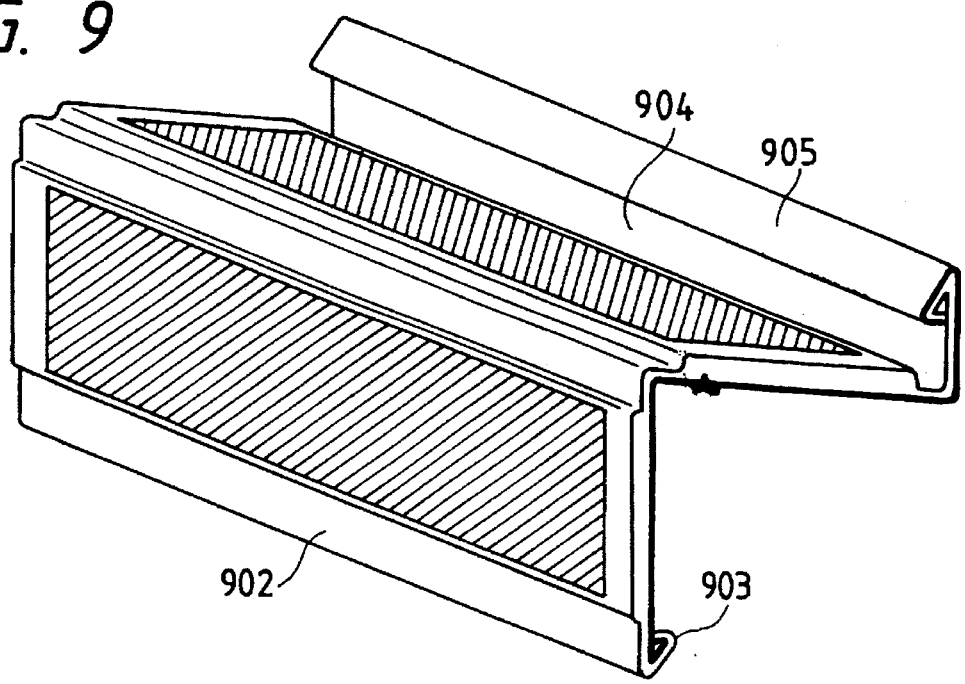
FIG. 9 is a schematic drawing of a solar cell module of the present invention.

Then, the above-mentioned solar cell module 1101 was folded by a roller former into the shape as shown in FIG. 9. That is, its central portion was first folded. One of the end portions was then folded in the direction of the backside at an acute angle, twice, to form engagement portion 903. The other opposite end portion was folded at 90 degrees in the direction of the solar cell side as shown by reference numeral 904 and was again bent at an acute angle to the direction of the weather resistant film side. Finally, it was once more folded at an acute angle to form rising engagement portion 905. Installation was made in the same manner as in Example 1.

In this Example 3, a solar cell module having good foldability not only at the ends but at the central portion was produced. The module folded at the central portion was able to maximize effective use of the limited area of the solar cell.

No whitening at the folded portions nor cracking of the filler were found. Thus, a solar cell module with good appearance was obtained.

No peeling of the filler and weather-resistant film was observed. In this way, reliability of the folding portion was improved.

EXAMPLE 4

The solar cell module according to this example is characterized in that there is a gradual taper-shaped change in the thickness of filler from the thicker filler part for protecting the solar cell element to the thinner filler part of the fabrication zone.

Figure 24:
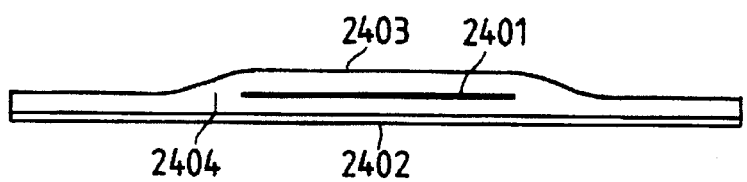
FIG. 24 is a cross-sectional drawing of a solar cell module in another embodiment of the present invention before the folding step.
Figure 25:
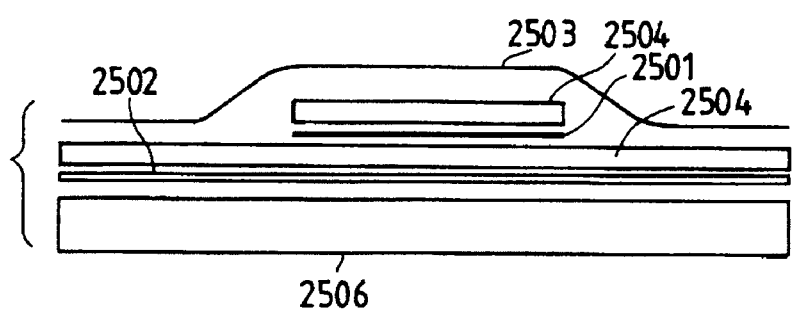
FIG. 25 is a detailed cross-sectional drawing of the module of FIG. 24.

FIG. 24 shows a schematic sectional view of the solar cell module before being folded in this example. Preparation of this solar cell module is explained by referring to FIG. 25.

The following materials were laminated on a heated steel sheet 2506 in the following order similarly to Example 1: back reinforcement silicone rubber sheet 2502, filler 2504 in a sheet form, serially connected photovoltaic elements 2501, sheet form filler 2504, and weather resistant film 2503. The thinner sheet filler was laminated in the vicinity of the ends of the fabrication zone. A heat resistant silicone rubber sheet was then placed over the above lamination materials to reduce the pressure between the silicone rubber sheet 2502 and heated steel sheet 2506 to 10 torr by using a vacuum pump. Thereafter, the assembly was heated up to 150° C. and kept at 150° C. for 30 minutes, and allowed to cool down to room temperature while maintaining the vacuum. Allowing some amount of the filler to flow from the thicker filler area to the thinner filler area, a solar cell module having a gentle sloping surface was obtained. The thickness of the filler was 2 mm at the thicker filler area and 0.5 mm at the thinner filler area.

Folding and installing were made in the same way as in Example 1.

The solar cell module of this example was light with better processability, higher reliability, and lower production cost. In addition, compared with Example 1, it also resulted in a better appearance, nearly the same as a conventional roof, since the gentle sloping surface was made from the thicker filler area to thinner filler area.

EXAMPLE 5

The solar cell module according to this example is characterized in that different kinds of fillers are used in the protection zone for the solar cell elements and in the fabrication zone.

Figure 26:
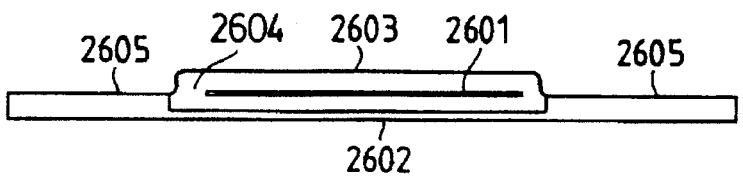
FIG. 26 is a cross-sectional drawing of a solar cell module in another embodiment of the present invention before the folding step.
Figure 27:
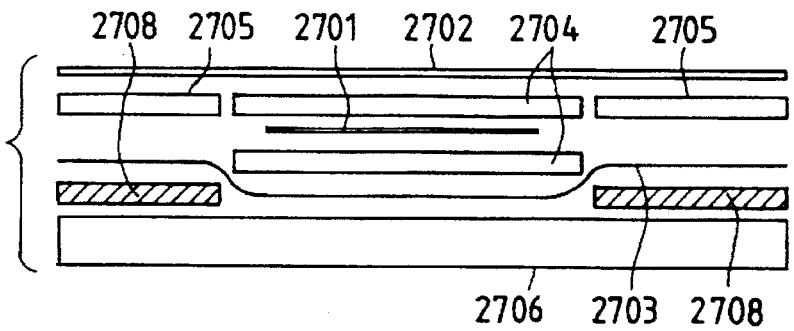
FIG. 27 is a detailed cross-sectional drawing of the module of FIG. 26.

FIG. 26 shows a schematic sectional view of the solar cell module of this example before being folded. Preparation of this solar cell module is explained by referring to FIG. 27.

Numerals 2601, 2602, 2603 and 2604 indicate a solar cell element, a back reinforcing plate, a weather resistant film, and a filler, respectively. Numeral 2605 indicates a filler different from a filler 2604.

The following lamination materials, prepared similarly to Example 1, were laminated on a heated steel sheet in the following order: mold 2708 that limits flow of the filler when heated and determines the module surface shape; weather resistant film 2703; sheet filler 2704 that is placed only in the thicker filler area; serially connected solar cell elements 2701; filler 2704 for the thicker filler area. However, only filler 2705 was laminated in the area of fabrication with thinner filler. In the fabrication area, EEA resin was used as the filler that was different from the filler protecting the solar cell elements. Back reinforcing plate 2702 was placed over filler sheets 2704 and 2705. Then, a heat resistant silicone rubber sheet was overlapped. Thereafter, the space between the silicone rubber sheet and the steel sheet 2706 having the heat source was subjected to a vacuum of 10 torr by use of a vacuum pump. The assembly was then heated up to 150° C. and kept at 150° C. for 30 minutes, and allowed to cool to room temperature while the vacuum was maintained. Thereby, a solar cell module in which different kinds of the fillers were used in the module protection area and in the fabrication area was obtained. The thickness of fillers was 2 mm at the thicker filler area and 0.5 mm at the thinner filler area.

The folding and installing were made in the same way as in Example 1.

This example is an example of a solar cell module in which wider selection of the fillers is possible.

It is not necessary to select a highly transparent filler for the fabrication zone. It is possible to select a material which can be processed easily compared with the filler for the protection of the solar cell elements. A material of favorable color may be selected.

EXAMPLE 6

The solar cell module according to this example is characterized in that the front surface is made flat by use of a steel plate that is subjected to a plasticity processing for the back reinforcing plate.

Figure 28:
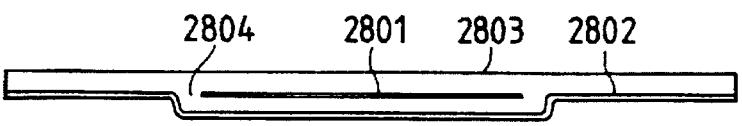
FIG. 28 is a cross-sectional drawing of a solar cell module in another embodiment of the present invention before the folding step.
Figure 29:
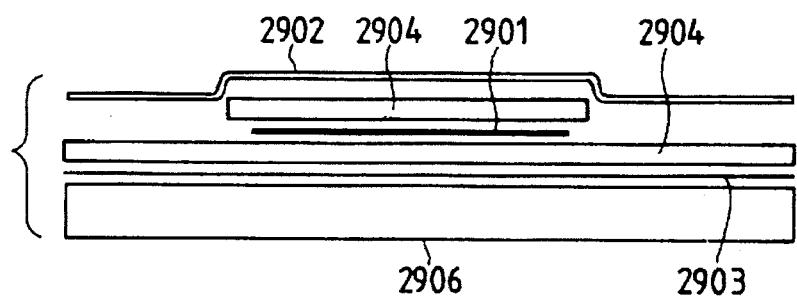
FIG. 29 is a detailed cross-sectional drawing of the module of FIG. 28.

FIG. 28 shows a sectional drawing of the solar cell module before being folded in this example. Preparation of this solar cell module is explained by referring to FIG. 29.

Numerals 2801, 2802, 2803 and 2804 indicate a solar cell element, a back reinforcing plate, a weather resistant film, and a filler, respectively.

Except for the back reinforcing plate, the materials were prepared for lamination in the same way as in Example 1. On a heated steel sheet, weather resistant film 2903, filler 2904, serially connected solar cell elements 2901, filler 2904, and back reinforcement metal plate 2902 that was folded as shown in the figure were laminated in this order. Then, a sheet of heat resistant silicone rubber was overlapped. Thereafter, the space between the silicone rubber sheet and the steel sheet 2706 having the heat source was subjected to a vacuum of 10 torr by use of a vacuum pump. The assembly was then heated up to 150° C. and kept there for 30 minutes, and allowed to cool to room temperature while vacuum was maintained. Thereby, a solar cell module was obtained. The thickness of the filler was 2 mm at the thicker filler area and 0.5 mm at the thinner filler area.

The folding and installing were made in the same way as Example 1.

According to the solar cell module of this example, a lightweight solar cell module was obtained that is excellent in processability and reliability and inexpensively producible. In addition, this solar cell had a flat surface giving a more natural appearance which did not resemble that of a solar cell.

EXAMPLE 7

The solar cell module according to this example is characterized in that the solar cell module was folded toward the incident side.

Figure 30:
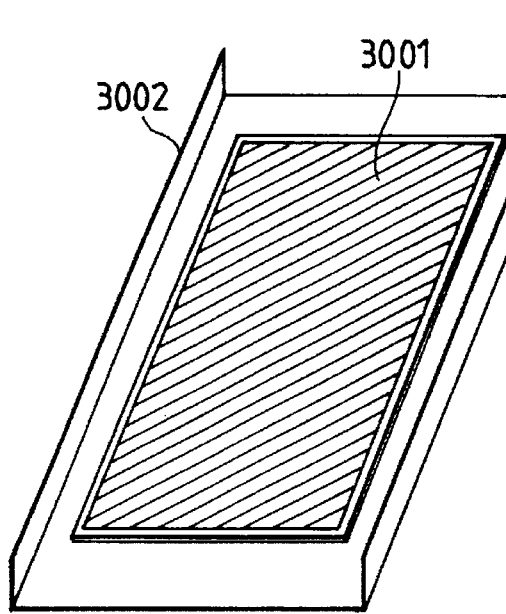
FIG. 30 is a schematic drawing of a solar cell module of the present invention.

FIG. 30 is a schematic view of the solar cell module of this example.

In this example, the solar cell module prepared in the same way as in Example 2 was used and installed by folding toward the incident (light receiving) side. The installation was made in a manner called batten (ribbed) seam roofing.

The solar cell module according to this example made it possible to solve problems such as spring back and wave formation in the periphery caused when the thicker filler area was folded toward the light incident side.

EXAMPLE 8

The solar cell module according to this example is characterized in that the thinner filler fabrication area is limited to the folded part and associated minimum area.

Figure 31:
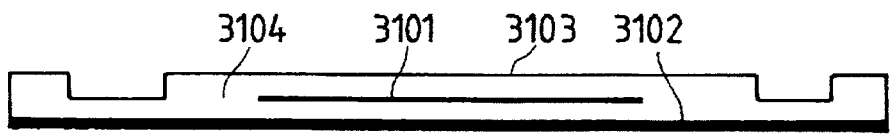
FIG. 31 is a cross-sectional drawing of a solar cell module in another embodiment of the present invention before the folding step.

FIG. 31 shows a cross-sectional view of the solar cell module before being folded in this example.

Numerals 3101, 3102, 3103, and 3104 indicate a solar cell element, a back reinforcing plate, a weather resistant film, and a filler, respectively.

Figure 32:
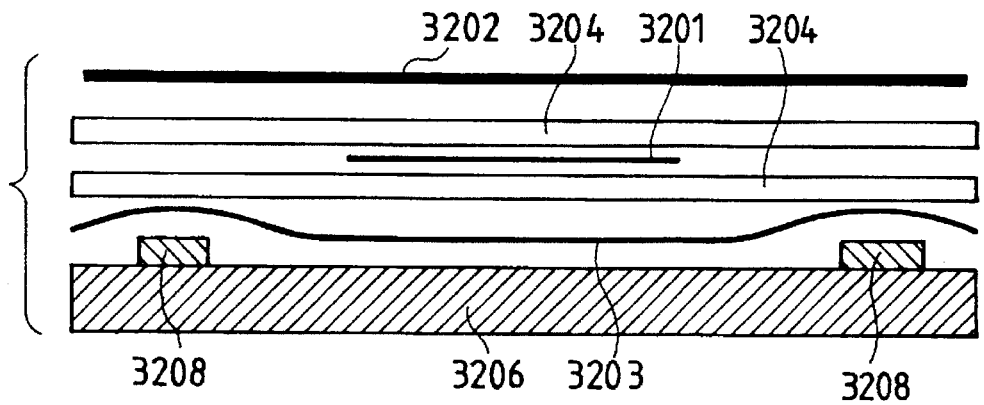
FIG. 32 is a detailed cross-sectional drawing of the module of FIG. 31.

Preparation of this solar cell module is explained by referring to FIG. 32.

On a heated steel sheet, jig 3208 for formation of the thinner filler layer was placed. Thereafter, materials for lamination prepared in the same way as Example 1 were laminated in the order of weather resistant film 3203, filler 3204, serially connected photovoltaic elements 3201, filler 3204, and back reinforcement metal plate 3202. Then, a sheet of heat resistant silicone rubber was overlapped. Thereafter, the space between the silicone rubber sheet and the steel sheet 3206 having the heat source was subjected to a vacuum of 10 torr by use of a vacuum pump. The assembly was then heated up to 150° C. and kept there for 30 minutes, and allowed to cool to room temperature while the vacuum was maintained.

Unlike Example 1, the amount of the filler in sheet form was made the same both in the fabrication area and the generating area. The thinner filler part was formed by the flow of the filler from the fabrication area by atmospheric pressure on the back reinforcing metal plate. The thickness of the filler was 2.2 mm at the thicker filler area and 0.8 mm at the thinner filler area.

The folding and installing were made in the same way as Example 7.

The solar cell module according to this example made it possible to improve the workability of a solar cell module without sacrificing the processability of the solar cell module.

EXAMPLE 9

The solar cell module according to this example is characterized in that two methods for the folding were used, one being a roller former and the other being a mold and a blade.

In this example, the solar cell module of Example 2 was used.

Figure 33:
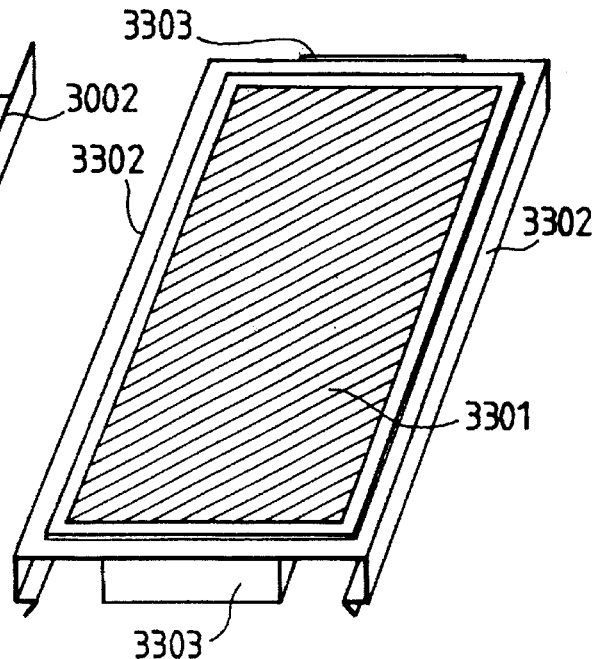
FIG. 33 is a schematic drawing of another solar cell module of the present invention.

FIG. 33 shows a schematic view of the solar cell module of this example.

In this example, the four corners of the solar cell module were cut. Both ends of the two longer sides were folded by using a roller former to make the engagement portions for a supporter as shown by reference numeral 3302. Both ends of the two shorter sides were then folded by using a bender machine as shown by reference numeral 3303.

According to the solar cell module of this example, the workability was improved by using a roller former for bending the two longer sides.

EXAMPLE 10

The solar cell module according to this example is characterized in that the back reinforcing plate was exposed at the place closest to the ends.

Figure 34:
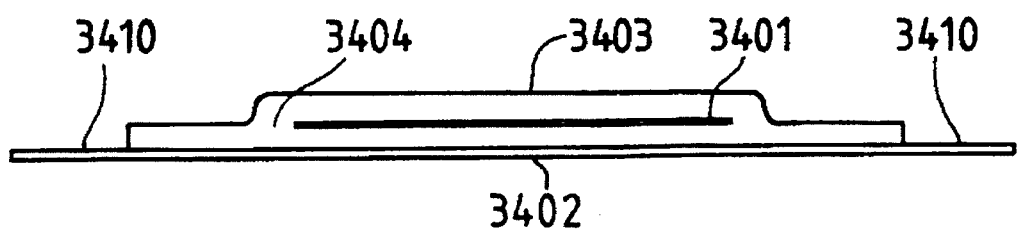
FIG. 34 is a cross-sectional drawing of a solar cell module in another embodiment of the present invention before the folding step.

FIG. 34 shows a schematic cross-sectional view of the solar cell module of this example before being folded.

Numerals 3401, 3402, 3403, 3404 and 3410 indicate a solar element, a back reinforcing plate, a weather resistant film, a filler, and an exposed portion of the plate, respectively.

Figure 35:
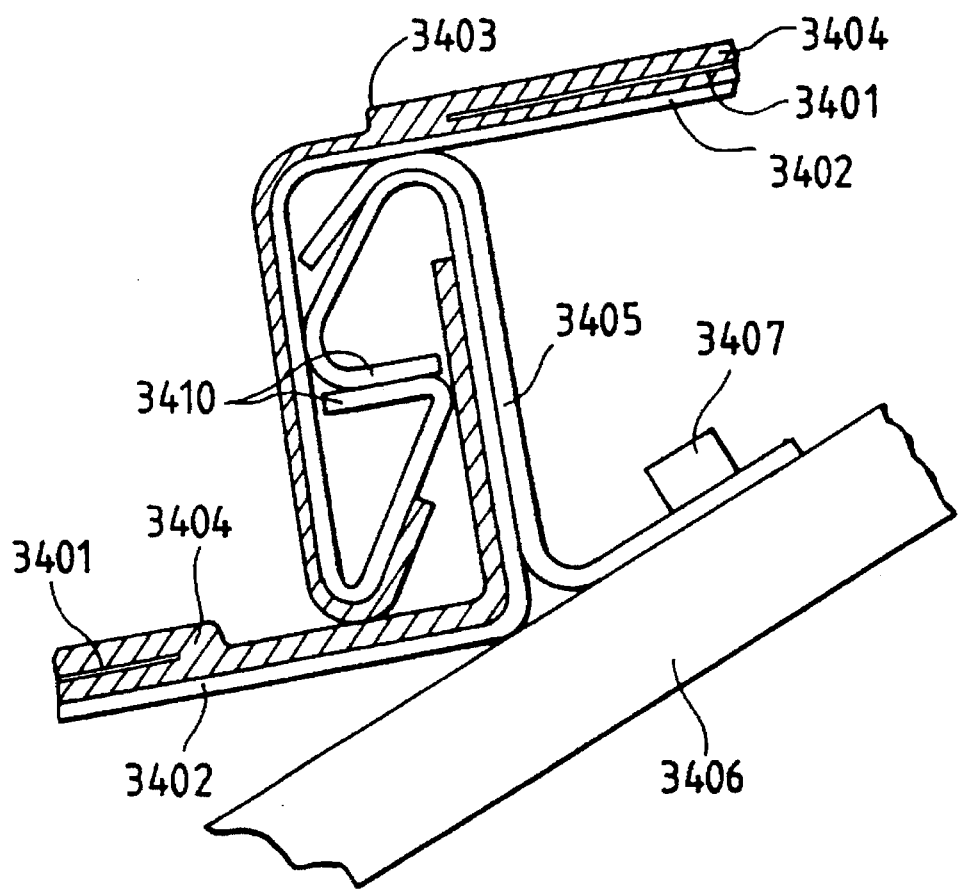
FIG. 35 is a cross-sectional drawing of a solar cell module in another embodiment of the present invention after the folding step.

FIG. 35 is a schematic cross-sectional drawing of the folded portion and its vicinity when the solar cell module of this example is installed.

The preparation method of the solar cell is explained at first.

On a heated steel sheet, a mold that limits the flow of the filler when heated and determines the module surface shape and a jig that forms the thinner part of the filler were placed. Thereafter, the materials for lamination prepared in the same way as Example 1 were laminated in the order of the weather resistant film, filler, serially connected photovoltaic elements, filler, and back reinforcement metal plate. In these procedures, the weather resistant film and the filler were made smaller so that they do not cover the whole area of the back reinforcing plate. Then, a sheet of heat resistant silicone rubber was overlapped. Thereafter, the space between the silicone rubber sheet and the steel sheet having the heat source was subjected to a vacuum of 10 torr by use of a vacuum pump. The assembly was then heated up to 150° C. and kept at 150° C. for 30 minutes, and allowed to cool to room temperature while the vacuum was maintained.

Thereby, a solar cell module having a back reinforcing plate that was exposed at the areas closest to the ends was obtained as shown by reference numeral 3410. The thickness of the filler was 2 mm at the thicker filler area and 0.5 mm at the thinner filler area. The folding and installing were made in the same way as Example 1. As seen in FIG. 35, the place where the adhesion between the back reinforcing plate and the filler starts was located inside the engagement portion which was not exposed to rain and wind.

The solar cell module according to this example shows an example of the surface shape.

It is required that no end or seam of the weather resistant film be present at the places exposed to rain and wind. However, it is not necessarily required for the weather resistant film and filler to cover the whole area of the back reinforcing plate. This is because the weather resistant film need not protect the end portions of the back reinforcing plate which are located, after installation, at places not exposed to rain and wind and also because it is less likely that problems occur such as, for example, peeling off of the filler and weather resistant film at the area and ingress of water.

According to the solar cell module of this example, the amount of both filler and weather resistant film can be reduced; thereby, the production cost can be reduced. Furthermore, better foldability is attained at the area where no filler is used.

ADVANTAGES OF THE INVENTION

According to the solar cell module of the present invention, durability of the weather resistant film against external environmental factors such as temperature, humidity, wind, and rain has been obtained.

Durability against external environmental factors such as temperature, humidity, wind, and rain has been also brought about by the filler that encapsulates the solar cell elements, which also protects the solar cell from impact.

Structural strength has been maintained by the back reinforcing plate and by the folding. Thereby, a frame body has become unnecessary, which has made the module light and the cost reduced. Fixed installation is now possible by using the folded part.

By reducing the amount of filler, the bending strain has been decreased and peeling between the back reinforcing plate and the filler has been prevented. Also, the problem of spring back, in which the required bend angle is not obtainable and only an insufficiently sharp angle is attained, has been overcome since the elasticity restoration of the filler is decreased. The problem of wave formation at the edge of a solar cell module when folding is applied near the edge of the solar cell module has also been reduced.

In addition, problems of cutting and collapsing occurring in the weather resistant film and filler when folding is performed by a roll molding machine have also been avoided. The pressure applied to solar cell elements is now reduced since the pressure applied by the presser roll of the roll molding machine is mitigated. Furthermore, the amount of filler to be used has been decreased, contributing to cost reduction. By making the filler thickness in the thinner flat area thereof, not less than 5 µm and not more than 1000 µm, the problems mentioned before are solved.

In addition, by not embedding the material for holding the filler, the solar cell elements are protected by the filler holding material, flow out of the filler can be prevented at an elevated temperature when the solar cell modules are laminated under vacuum and heat, the air remaining in the solar cell module can be exhausted to the outside, and the problems causing deterioration of the solar cell module has been avoided, including white turbidity of the folding part caused by peeling between the filler and the filler holding material, and their cutting and water flow thereinto.

By the fact that the material for holding the filler is non-woven fabric or woven fabric, high light transmittance, high porosity and high strength have resulted. By these effects, flow out of the filler can be further prevented at an elevated temperature when the solar cell modules are laminated under vacuum and heat, the air remaining in the solar cell module is further exhausted to outside. Decrease of the incident light can also be kept to a minimum.

By the fact that the non-woven fabric or woven fabric is ceramic non-woven fabric or woven fabric, glass non-woven fabric or woven fabric, or polypropylene non-woven fabric or woven fabric, high light transmittance, high porosity and high strength are secured. Thereby, sufficient protection against scratching and impacts to the solar cell module results. With the high light transmittance, the incident light decreases by a minimum amount. Deterioration and discoloration over a long period of time are inhibited, and disadvantageous effects are prevented. Since the solar cell modules are not deteriorated when they are laminated under vacuum and heat, flow out of the filler is prevented at an elevated temperature in this process and exhaustion of the remaining air in the solar cell module to the outside is further enhanced.

Furthermore, since the weather resistant film is a non-oriented film, elongation of the weather resistant film is large, and the problem of breaking of the weather resistant film in the step of folding is minimized. The non-oriented film also accommodates variation of the filler from the thick part to the thin part, and cutting or wrinkling therefore does not occur even for a solar cell module in which the thickness varies significantly.

Furthermore, since the back reinforcing plate is a metal plate, necessary strength as a structure and excellent workability have resulted. Excellent durability for outdoor use is secured thereby. Since metal plates have been conventionally used as roof materials, the convertibility therebetween is obtained. Due to the fact that the solar cell elements are bendable, the problem of cracking of the solar cell elements is avoided, and the thickness of the solar cell module can be made thin since limited rigidity is required, which contributes to making the weight small and the cost reduced.

Since the solar cell elements are amorphous silicon solar cell elements having, on a conductive substrate, a metallic electrode layer, an amorphous silicon semiconductor layer, a transparent conductive layer, and a grid electrode, thin solar cell elements can be manufactured inexpensively; less thick solar cell modules contribute to reduction of the weight and cost.

Since the solar cell elements are a plurality of amorphous silicon solar cell elements connected in series the cells having, on a conductive substrate, a metallic electrode layer, an amorphous silicon semiconductor layer, a transparent conductive layer, and a grid electrode, manufacturing of larger solar cell modules is possible; thereby, an array of solar cells with a large area can be constituted with a smaller number of solar cell modules. Required parts and workmanship per module are consequently reduced and the cost is down.

Since the folding is applied by using a roll molding machine, the fabrication can be continuous with high productivity, and the folding is possible in a shorter period and less expensively than the case where a bending machine with a receiver mold and blade is used. Thereby, molding shapes with complicated cross-section has become possible, and large and long modules can be manufactured simply.

What is claimed is:

1. A solar cell module comprising a weather resistant outer film, solar cell elements, a filler for encapsulating the solar cell elements, and a back reinforcing plate, wherein the non-generating area has a flat planar area containing thinner filler than the generating area, the thicker a filler part is connected to the thinner filler part through a gently sloped part having a tapered thickness, and the thinner part is folded.

2. The solar cell module according to claim 1, wherein the filler thickness "a" of the thinner filler layer planar area part is in the range $5 \leq a \leq 1000$ µm.

3. The solar cell module according to claim 1 or 2, wherein a material for holding the filler is embedded in said filler, and said flat planar area part having the thinner filler does not have an embedded material for holding the filler.

4. The solar cell module according to claim 3, wherein said material for holding the filler is a non-woven fabric or a woven fabric.

5. The solar cell module according to claim 4, wherein said non-woven fabric or woven fabric is a ceramic non-woven fabric or woven fabric, a glass non-woven fabric or woven fabric, or a polypropylene non-woven fabric or woven fabric.

6. The solar cell module according to claim 1, wherein said weather resistant outer film is a non-oriented film.

7. The solar cell module according to claim 1, wherein said back reinforcing plate is a metal plate.

8. The solar cell module according to claim 1, wherein said solar cell elements are bendable.

9. A solar cell module comprising a weather resistant outer film; amorphous silicon solar cell elements that have, on a substrate, a metallic electrode layer, an amorphous silicon semiconductor layer, a transparent conductive layer, and a grid electrode; a filler for encapsulating the solar cell elements, and a back reinforcing plate, wherein the non-generating area has a flat planar area containing a thinner filler than the generating area; the thicker filler part is connected to the thinner filler part through a gently sloped part having a tapered thickness; and the thinner part is folded.

10. The solar cell module according to claim 9, wherein the filler thickness "a" in the thinner filler layer planar area part is in the range $5 \leq a \leq 1000$ µm.

11. The solar cell module according to claim 9, wherein a material for holding the filler is embedded in said filler, and said flat planar area part having the thinner filler does not have an embedded material for holding the filler.

12. The solar cell module according to claim 11, wherein said material for holding the filler is a non-woven fabric or a woven fabric.

13. The solar cell module according to claim 12, wherein said non-woven fabric or woven fabric is a ceramic non-woven fabric or woven fabric, a glass non-woven fabric or woven fabric, or a polypropylene non-woven fabric or woven fabric.

14. The solar cell module according to claim 9, wherein said weather resistant outer film is a non-oriented film.

15. The solar cell module according to claim 9, wherein said back reinforcing plate is a metal plate.

16. The solar cell module according to claim 9, wherein said solar cell elements are bendable.

17. A solar cell module comprising a weather resistant outer film; amorphous silicon solar cell elements connected in series that have, on a substrate, a metallic electrode layer, an amorphous silicon semiconductor layer, a transparent conductive layer, and a grid electrode; a filler for encapsulating the solar cell elements, and a back reinforcing plate, wherein the non-generating area has a flat planar area containing a thinner filler than the generating area; that the thicker filler part is connected to the thinner filler part through a gently sloped part having a tapered thickness; and the thinner part is folded.

18. The solar cell module according to claim 17, wherein the filler thickness "a" in the thinner filler planar area part is in the range $5 \leq a \leq 1000$ µm.

19. The solar cell module according to claim 17, wherein a material for holding the filler is embedded in said filler, and said flat planar area part having the thinner filler does not have an embedded material for holding the filler.

20. The solar cell module according to claim 19, wherein said material for holding the filler is a non-woven fabric or a woven fabric.

21. The solar cell module according to claim 20, wherein said non-woven fabric or woven fabric is a ceramic non-woven fabric or woven fabric, a glass non-woven fabric or woven fabric, or a polypropylene non-woven fabric or woven fabric.

22. The solar cell module according to claim 17, wherein said weather resistant outer film is a non-oriented film.

23. The solar cell module according to claim 17, wherein said back reinforcing plate is a metal plate.

24. The solar cell module according to claim 17, wherein said solar cell elements are bendable.

25. A method for manufacturing a solar cell module that has a weather resistant outer film, solar cell elements, a filler for encapsulating the solar cells, and a back reinforcing plate, wherein the non-generating area has a thinner filler than the filler in the generating area and has a part connecting the thinner filler part to the thicker filler part through a gently sloped part having a tapered thickness, and the thin part is folded by means of a roll molding machine.

26. The method for manufacturing a solar cell module according to claim 25, wherein the filler thickness "a" in the thinner filler planar area is in the range $5 \leq a \leq 1000$ μm.

27. The method for manufacturing a solar cell module according to claim 25, wherein a material for holding the filler is embedded in said filer, and said thinner part does not have an embedded material for holding the filler.

28. The method for manufacturing a solar cell module according to claim 27, wherein said material for holding the filler is a non-woven fabric or a woven fabric.

29. The method for manufacturing a solar cell module according to claim 28, wherein said non-woven fabric or woven fabric is a ceramic non-woven fabric or woven fabric, a glass non-woven fabric or woven fabric, or a polypropylene non-woven fabric or woven fabric.

30. The method for manufacturing a solar cell module according to claim 25, wherein said weather resistant outer film is a non-oriented film.

31. The method for manufacturing a solar cell module according to claim 25, wherein said back reinforcing plate is a metal plate.

32. The method for manufacturing a solar cell module according to claim 25, wherein skid solar cell elements are bendable.

33. A solar cell module comprising a weather resistant outer film, solar cell elements, fillers for encapsulating the solar cell elements, and a back reinforcing plate, wherein the non-generating area has a flat planar area containing a thinner filler part than the generating area, the thinner filler part and the thicker filler part are formed with different fillers, and the thinner part is folded.

34. The solar cell module according to claim 33, wherein the filler thickness "a" in the thinner filler planar area is in the range $5 \leq a \leq 1000$ μm.

35. The solar cell module according to claim 33, wherein a material for holding the fillers is embedded in said fillers, and said flat planar area containing thinner fillers does not have an embedded material for holding the filler.

36. The solar cell module according to claim 35, wherein said material for holding the fillers is a non-woven fabric or a woven fabric.

37. The solar cell module according to claim 36, wherein said non-woven fabric or woven fabric is a ceramic non-woven fabric or woven fabric, a glass non-woven fabric or woven fabric, or a polypropylene non-woven fabric or woven fabric.

38. The solar cell module according to claim 33, wherein said weather resistant outer film is a non-oriented film.

39. The solar cell module according to claim 33, wherein said back reinforcing plate is a metal plate.

40. The solar cell module according to claim wherein said solar cell elements are bendable.

41. A solar cell module comprising a weather resistant outer film; amorphous silicon solar cell elements that have, on a substrate, a metallic electrode layer, an amorphous silicon semiconductor layer, a transparent conductive layer, and a grid electrode; fillers for encapsulating the solar cell elements, and a back reinforcing plate, wherein the non-generating area has a flat planar area containing thinner filler than the generating area; the thinner filler part and the thicker filler part are formed with different fillers; and the thinner part is folded.

42. The solar cell module according to claim 41, wherein the filler thickness "a" in the thinner filler planar area is in the range $5 \leq a \leq 1000$ μm.

43. The solar cell module according to claim 41, wherein a material for holding the fillers is embedded in said fillers, and said flat planar area containing a thinner filler does not have an embedded material for holding the filler.

44. The solar cell module according to claim 43, wherein said material for holding the fillers is a non-woven fabric or a woven fabric.

45. The solar cell module according to claim 44, wherein said non-woven fabric or woven fabric is a ceramic non-woven fabric or a woven fabric, a glass non-woven fabric or woven fabric, or a polypropylene non-woven fabric or woven fabric.

46. The solar cell module according to claim 41, wherein said weather resistant outer film is a non-oriented film.

47. The solar cell module according to claim 41, wherein said back reinforcing plate is a metal plate.

48. The solar cell module according to claim 41, wherein said solar cell elements are bendable.

49. A solar cell module comprising a weather resistant outer film; amorphous silicon solar cell elements connected in series that have, on a substrate, a metallic electrode layer, an amorphous silicon semiconductor layer, a transparent conductive layer, and a grid electrode; a filler for encapsulating the solar cell elements, and a back reinforcing plate, wherein the non-generating area has a flat planar area containing a thinner filler than the generating area; the thinner filler part and the thicker filler part are formed with different fillers; and the thinner part is folded.

50. The solar cell module according to claim 49, wherein the filler thickness "a" in the thinner filler planar area is in the range $5 \leq a \leq 1000$ μm.

51. The solar cell module according to claim 49, wherein a material for holding the fillers is embedded in said fillers, and said flat planar area containing thinner fillers does not have an embedded material for holding the filler.

52. The solar cell module according to claim 51, wherein said material for holding the fillers is a non-woven fabric or a woven fabric.

53. The solar cell module according to claim 52, wherein said non-woven fabric or woven fabric is a ceramic non-woven fabric or woven fabric, a glass non-woven fabric or woven fabric, or a polypropylene non-woven fabric or woven fabric.

54. The solar cell module according to claim 49, wherein said weather resistant outer film is a non-oriented film.

55. The solar cell module according to claim 49, wherein said back reinforcing plate is a metal plate.

56. The solar cell module according to claim 49, wherein said solar cell elements are bendable.

57. A method for manufacturing a solar cell module that has a weather resistant outer film, solar cell elements, fillers for embedding the solar cells, and a back reinforcing plate, wherein the non-generating area has thinner fillers than the fillers in the generating area said thinner filler part and said thicker filler part are formed with different fillers, and that the thin part is folded by means of a roll molding machine.

58. The method for manufacturing a solar cell module according to claim 57, wherein the filler thickness "a" in the thinner filler planar area is in the range 5≦a≦1000 μm.

59. The method for manufacturing a solar cell module according to claim 57, wherein a material for holding the fillers is embedded in said fillers, and said thinner part does not have an embedded material for holding the filler.

60. The method for manufacturing a solar cell module according to claim 59, wherein said material for holding the fillers is a non-woven fabric or a woven fabric.

61. The method for manufacturing a solar cell module according to claim 60, wherein said non-woven fabric or woven fabric is a ceramic non-woven fabric or woven fabric, a glass non-woven fabric or woven fabric, or a polypropylene non-woven fabric or woven fabric.

62. The method for manufacturing a solar cell module according to claim 57, wherein said weather resistant outer film is a non-oriented film.

63. The method for manufacturing a solar cell module according to claim 57, wherein said back reinforcing plate is a metal plate.

64. The method for manufacturing a solar cell module according to claim 57, wherein said solar cell elements are bendable.

65. A solar cell module comprising a weather resistant outer film, solar cell elements, a filler for encapsulating the solar cell elements, and a back reinforcing plate, wherein the non-generating area of the solar cell module has a thinner filler than the filler of the generating area, and the back reinforcing plate corresponding to said thinner part is folded so as to face the light incident surface.

66. The solar cell module according to claim 65, wherein the filler thickness "a" in the thinner filler planar area is in the range 5≦a≦1000 μm.

67. The solar cell module according to claim 65, wherein a material for holding the filler is embedded in said filler, and that said non-generating area containing thinner filler does not have an embedded material for holding the filler.

68. The solar cell module according to claim 67, wherein said material for holding the filler is a non-woven fabric or a woven fabric.

69. The solar cell module according to claim 68, wherein said non-woven fabric or woven fabric is a ceramic non-woven fabric or woven fabric, a glass non-woven fabric or woven fabric, or a polypropylene non-woven fabric or woven fabric.

70. The solar cell module according to claim 65, wherein said weather resistant outer film is a non-oriented film.

71. The solar cell module according to claim 65, wherein said back reinforcing plate is a metal plate.

72. The solar cell module according to claim 65, wherein said solar cell elements are bendable.

73. A method for manufacturing a solar cell module comprising a weather resistant outer film, solar cell elements, a filler for encapsulating the solar cells, and a back reinforcing plate, wherein the non-generating area of said solar cell module has a thinner filler than the filler of the generating area, and the back reinforcing plate corresponding to said thinner part is folded by means of a roll molding machine so as to face the light incident surface.

74. The method for manufacturing a solar cell module according to claim 73, wherein the filler thickness "a" in the thinner filler planar area is in the range 5≦a≦1000 μm.

75. The method for manufacturing a solar cell module according to claim 73, wherein a material for holding the filler is embedded in said filler, and that said thinner part does not have an embedded material for holding the filler.

76. The method for manufacturing a solar cell module according to claim 75, wherein said material for holding the fillers is a non-woven fabric or a woven fabric.

77. The method for manufacturing a solar cell module according to claim 76, wherein said non-woven fabric or woven fabric is a ceramic non-woven fabric or woven fabric, a glass non-woven fabric or woven fabric, or a polypropylene non-woven fabric or woven fabric.

78. The method for manufacturing a solar cell module according to claim 73, wherein said weather resistant outer film is a non-oriented film.

79. The method for manufacturing a solar cell module according to claim 73, wherein said back reinforcing plate is a metal plate.

80. The method for manufacturing a solar cell module according to claim 73, wherein said solar cell elements are bendable.

81. The solar cell module according to any one of claims 1, 9, 17, 33, 41, 49, and 65, wherein said thinner filler part is formed only in the folded part.

82. A method for manufacturing a solar cell module according to any one of claims 25, 57, and 73, wherein the folding is performed only at the thinner filler part.

83. A method for manufacturing a solar cell module according to claim 82, wherein said folding is performed by a roll molding machine, a mold and a blade.

84. A method for manufacturing a solar cell module according to any one of claims 25, 57, and 73, characterized by that said folding performed by means of a roll molding machine, a mold, and a blade.

85. A solar cell module according to any one of claims 1, 9, 17, 33, 41, 49, and 65, wherein the back reinforcing plate is exposed at the end parts of said solar cell module.

86. A method of making a solar cell module according to any one of claims 25, 57 and 77, wherein the back reinforcing plate is exposed at the end parts of said solar cell module.

87. A solar cell module comprising a weather resistant outer film, solar cell elements, a filler for encapsulating the solar cell elements, and a back reinforcing plate, wherein the non-generating area has a flat planar area containing a thinner filler than the generating area, and the flat planar area containing thinner filler is folded.

88. The solar cell module according to claim 87, wherein the filler thickness "a" in the thinner filler planar area is in the range 5a≦1000 μm.

89. The solar cell module according to claim 87, wherein a material for holding the filler is embedded in said filler, and said flat planar area containing thinner filler does not have an embedded material for holding the filler.

90. The solar cell module according to claim 89, wherein said material for holding the filler is a non-woven fabric or a woven fabric.

91. The solar cell module according to claim 90, wherein said non-woven fabric or woven fabric is a ceramic non-woven fabric or woven fabric, a glass non-woven fabric or a woven fabric, or a polypropylene non-woven fabric or woven fabric.

92. The solar cell module according to claim 87, wherein said weather resistant outer film is a non-oriented film.

93. The solar cell module according to claim 87, wherein said back reinforcing plate is a metal plate.

94. The solar cell module according to claim 87, wherein said solar cell elements are bendable.

95. A solar cell module comprising a weather resistant outer film; amorphous silicon solar cell elements that have, on a substrate, a metallic electrode layer, an amorphous silicon semiconductor layer, a transparent conductive layer, and a grid electrode; a filler for encapsulating the solar cell elements, and a back reinforcing plate, wherein the non-generating area has a flat planar area containing thinner filler than the generating area; and the flat planar area containing thinner filler is folded.

96. The solar cell module according to claim 95, wherein the filler thickness "a" in the thinner filler planar area is in the range $5 \leq a \leq 1000$ µm.

97. The solar cell module according to claim 95, wherein a material for holding the filler is embedded in said filler, and said flat planar area containing thinner filler does not have an embedded material for holding the filler.

98. The solar cell module according to claim 97, wherein said material for holding the filler is a non-woven fabric or a woven fabric.

99. The solar cell module according to claim 98, wherein said non-woven fabric or woven fabric is a ceramic non-woven fabric or woven fabric, a glass non-woven fabric or woven fabric, or a polypropylene non-woven fabric or woven fabric.

100. The solar cell module according to claim 95, wherein said weather resistant outer film is a non-oriented film.

101. The solar cell module according to claim 95, wherein said back reinforcing plate is a metal plate.

102. The solar cell module according to claim 95, wherein said solar cell elements are bendable.

103. A solar cell module comprising a weather resistant outer film; amorphous silicon solar cell elements connected in series that have, on a substrate, a metallic electrode layer, an amorphous silicon semiconductor layer, a transparent conductive layer, and a grid electrode; a filler for encapsulating the solar cell elements, and a back reinforcing plate, wherein the non-generating area has a flat planar area containing thinner filler than the generating area; and the flat planar area containing thinner filler is folded.

104. The solar cell module according to claim 103, wherein the filler thickness "a" in the thinner filler planar area is in the range $5 \leq a \leq 1000$ µm.

105. The solar cell module according to claim 103, wherein a material for holding the filler is embedded in said filler, and said flat planar area containing thinner filler does not have an embedded material for holding the filler.

106. The solar cell module according to claim 105, wherein said material for holding the filler is a non-woven fabric or a woven fabric.

107. The solar cell module according to claim 106, wherein said non-woven fabric or woven fabric is a ceramic non-woven fabric or woven fabric, glass non-woven fabric or woven fabric, or a polypropylene non-woven fabric or woven fabric.

108. The solar cell module according to claim 103, wherein said weather resistant outer film is a non-oriented film.

109. The solar cell module according to claim 103, wherein said back reinforcing plate is a metal plate.

110. The solar cell module according to claim 103, wherein said solar cell elements are bendable.

111. A method for manufacturing a solar cell module that has a weather resistant outer film, solar cell elements, a filler for encapsulating the solar cells, and a back reinforcing plate, wherein the non-generating area is folded by means of a roll molding machine, wherein the non-generating area has a flat planar area containing thinner filler than the generating area; and the flat planar area containing thinner filler is folded by means of said roll molding machine.

112. The method for manufacturing a solar cell module according to claim 111, wherein the filler thickness "a" in the thinner filler planar area is in the range $5 \leq a \leq 1000$ µm.

113. The method for manufacturing a solar cell module according to claim 111, wherein a material for holding the fillers is embedded in said fillers, and said thinner part does not have an embedded material for holding the filler.

114. The method for manufacturing a solar cell module according to claim 113, wherein said material for holding the fillers is a non-woven fabric or a woven fabric.

115. The method for manufacturing a solar cell module according to claim 114, wherein said non-woven fabric or woven fabric is a ceramic non-woven fabric or woven fabric, a glass non-woven fabric or woven fabric, or a polypropylene non-woven fabric or woven fabric.

116. The method for manufacturing a solar cell module according to claim 114, wherein said weather resistant outer film is a non-oriented film.

117. The method for manufacturing a solar cell module according to claim 114, wherein said back reinforcing plate is a metal plate.

118. The method for manufacturing a solar cell module according to claim 114, wherein said solar cell elements are bendable.

* * * * *

UNITED STATES PATENT AND TRADEMARK OFFICE
CERTIFICATE OF CORRECTION

PATENT NO. : 5,651,837

DATED : July 29, 1997

INVENTOR(S): TAKASHI OHTSUKA ET AL.

It is certified that error appears in the above-identified patent and that said Letters Patent is hereby corrected as shown below:

COLUMN 1
Line 50, "change ability" should read --changeability--.

COLUMN 2
Line 9, "of" should read --to--.

COLUMN 8
Line 41, "363" should read --303--.

COLUMN 9
Line 50, "atkyd," should read --alkyd,--.

COLUMN 12
Line 48, "$P_3$, $Si_4$," should read --$PH_3$, $SiH_4$,--.

COLUMN 16
Line 2, "in." should read --in--.

COLUMN 21
Line 54, "a" should be deleted.

COLUMN 23
Line 19 "filer," should read --filler,--;
Line 64, "claim" should reac --claim 33,--.

UNITED STATES PATENT AND TRADEMARK OFFICE
CERTIFICATE OF CORRECTION

PATENT NO. : 5,651,837

DATED : July 29, 1997

INVENTOR(S): TAKASHI OHTSUKA ET AL.

It is certified that error appears in the above-identified patent and that said Letters Patent is hereby corrected as shown below:

<u>COLUMN 26</u>
Line 35, "77," should read --73,--.

Signed and Sealed this

Tenth Day of March, 1998

Attest:

BRUCE LEHMAN

Attesting Officer

Commissioner of Patents and Trademarks